United States Patent
Kubin et al.

(10) Patent No.: US 7,813,496 B2
(45) Date of Patent: Oct. 12, 2010

(54) METHOD FOR REDUCING A COMPUTATIONAL COMPLEXITY IN NON-LINEAR FILTER ARRANGEMENTS AS WELL AS CORRESPONDING FILTER ARRANGEMENTS

(75) Inventors: Gernot Kubin, Graz (AT); Gerhard Paoli, Villach (AT); David Schwingshackl, Villach (AT)

(73) Assignee: Lantiq Deutschland GmbH, Neubiberg (DE)

( * ) Notice: Subject to any disclaimer, the term of this patent is extended or adjusted under 35 U.S.C. 154(b) by 1034 days.

(21) Appl. No.: 11/133,119

(22) Filed: May 19, 2005

(65) Prior Publication Data
US 2005/0286668 A1  Dec. 29, 2005

(30) Foreign Application Priority Data
May 19, 2004  (DE) .................. 10 2004 024 823

(51) Int. Cl.
*H04M 9/08*  (2006.01)
(52) U.S. Cl. ................................. 379/406.02
(58) Field of Classification Search .............. 370/489; 379/406.02
See application file for complete search history.

(56) References Cited

U.S. PATENT DOCUMENTS 6,717,981 B1 * 4/2004 Mohindra .................. 375/219

7,145,487 B1 * 12/2006 Anderson et al. ........... 341/106

OTHER PUBLICATIONS

Fliege, Norbert, "Multiraten-Signalverarbeitung: Theorie und Anwendungen," B.G. Teubner Stuttgart, pp. 1-8, 31, 40-44, 114-140 (1993). <Precise Explanation Included>.

Gadre, Vikram M. et al., "Using Multirate Architectures in Realizing Quadratic Volterra Kernels," IEEE Transactions on Signal Processing, vol. 44, No. 11, pp. 2891-2895 (Nov. 1996).

Küch, F. et al., "Nonlinear Line Echo Cancellation Using a Simplified Second Order Volterra Filter," IEEE International Conference on Acoustics, Speech, and Signal Processing, vol. 2, pp. 1117-1120 (2002).

Vaidyanathan, P.P., "Multirate Digital Filters, Filter Banks, Polyphase Networks, and Applications: A Tutorial," Proceedings of the IEEE, vol. 78, No. 1, pp. 56-93 (Jan. 1990).

* cited by examiner

*Primary Examiner*—Alexander Jamal
(74) *Attorney, Agent, or Firm*—Dicke, Billig & Czaja, PLLC

(57) ABSTRACT

A method for creating a form of a non-linear filter suitable for reducing a computational complexity is proposed. The filter is resolved into polyphase components in such a way that the polyphase components can be interchanged with a conversion of the sampling rate of a signal to be sent to the filter or of a signal to be emitted by the filter. Corresponding filters and filter arrangements are also proposed. In this way, a computational complexity for calculating the signal to be emitted by the filter can be significantly simplified. The invention can be used in echo compensation.

27 Claims, 16 Drawing Sheets

METHOD FOR REDUCING A COMPUTATIONAL COMPLEXITY IN NON-LINEAR FILTER ARRANGEMENTS AS WELL AS CORRESPONDING FILTER ARRANGEMENTS

CROSS-REFERENCE TO RELATED APPLICATIONS

This Utility Patent Application claims priority to German Patent Application No. DE 10 2004 024 823.0, filed on May 19, 2004, which is incorporated herein by reference.

BACKGROUND

The present invention relates to a method for creating a form of a non-linear Volterra filter and other non-linear filters that is suitable for reducing a computational complexity, method for reducing a computational complexity of filter arrangements that comprise devices for rate conversion, correspondingly designed filters and filter circuits, as well as the use of these filters and/or filter circuits in a device for echo compensation in a communications system. In this connection, apart from Volterra filters, in particular filters that consist of two linear filters with a so-called static non-linearity connected therebetween are also considered.

In many systems that include digital as well as analog circuit parts, the digital signal processing is carried out at different sampling rates, for example, in the case of interpolation/decimation paths, which are necessary for the oversampling of $\Sigma\Delta$ converters, or, as is illustrated hereinafter, in echo suppression. If filters that exhibit a non-linear behavior are necessary in these systems, then correspondingly non-linear filters have to be used. This will be discussed hereinafter by way of example on the basis of a special application, namely non-linear echo extinction.

In general two types of echoes may be distinguished in communications systems, namely acoustic echoes and hybrid or electronic echoes. Acoustic echoes occur when sound from a loudspeaker of a communications system reaches a microphone of the same communications system. An example of such a situation is free speech in mobile phones, for example when driving. In this situation the sound from a loudspeaker of the free speech system can reach the corresponding microphone, which leads to an echo signal. If this echo signal is not damped, the result is that a conversation partner hears his own voice in his headphone or loudspeaker. A hybrid or electronic echo occurs for example with two-wire/four-wire conversions, as are present in conventional telecommunications equipment. Signals that are sent from the four-wire section to the two-wire section are partially reflected in the hybrid, which generates an echo signal.

Since, as described above, this echo signal may cause interference, various techniques are used to suppress echo. In general the echo path is simulated as closely as possible, for example by a filter device, in order thereby to extinguish as effectively as possible the actual echo signal with a simulated echo signal.

A typical communications system of this type, which can be used for a full duplex transmission of data or conversations, is diagrammatically illustrated in FIG. 34. Here only the relevant parts for the echo suppression are illustrated.

The illustrated system includes an analog part 158 and a digital part 159. A separating line between these two parts is illustrated by the dotted line. A transmitting path is diagrammatically illustrated in the lower half of FIG. 34 and a receiving path is diagrammatically illustrated in the upper half of FIG. 34.

A digital signal to be transmitted is passed via a line 125 to the illustrated device. The sampling rate of the transmitted signal fed via the line 125 is increased by a factor L in a sampling rate converter 122. This is normally performed by inserting "0" values in the signal (so-called "zero stuffing"). A digital low-pass filter 162 then performs an interpolation of the signal. The signal is noise shaped by a noise shaper 163 before the digital signal treated in this way is converted by a digital-analog converter 164 into an analog transmitted signal.

The signal converted in this way is fed to an analog low-pass filter 165 and a power amplifier 166. The thus amplified transmitted signal is fed to a hybrid 154, in which the two-wire/four wire conversion takes place. The transmitted signal is here passed to a transmitting/receiving line 155.

A received signal received via the transmitting/receiving line 155 is reversed through the hybrid 154 to a receiving filter 156 and passed to an anti-aliasing filter 157, both of which are analog filters. The analog received signal filtered in this way is then converted by an analog-digital converter 160 into a digital received signal, in which connection an oversampling normally takes place. The analog-digital converter 160 is followed by a digital low-pass filter 161 for the decimation and a sampling rate converter 123, which lowers the sampling rate of the digital received signal by a factor L. In the present example the factors L by which the sampling rate is increased in the sampling rate converter 122 and is reduced in the sampling rate converter 123 are identical. These two values may however also be different, especially if the transmitted signal and received signal are sent at different bandwidths and different frequencies, as is the case for example in ADSL (Asymmetric Digital Subscriber Line) transmission.

By means of the components described hereinbefore an echo path is formed that produces a non-linear component, dependent on the signal to be transmitted present at the line 125, at the output of the sampling rate converter 123. In order to suppress this component the echo path is simulated as accurately as possible by an echo compensator or echo filter 121 and the signal generated thereby is subtracted in an adder 124 from the output signal of the sampling rate converter 123. The echo-compensated signal generated in this way is then passed via a line 126 for further processing.

Since the echo path is non-linear, the echo filter 121 must also be a non-linear filter. In particular the power amplifier 166 for example frequently becomes a so-called static non-linearity, whose output depends only on an instantaneous value of a signal accessible to it. Strictly speaking, this non-linearity too is, however, dynamic, that is, its output depends both on the instantaneous value as well as on previous values of the signal passed to it.

In the most general form a so-called Volterra filter is in this connection used as non-linear echo filter, whose transient response is generally given by $$y[n] = h0 + \sum_{i=0}^{N1} h1(i)u[n-i] + \sum_{i1=0}^{N2}\sum_{i2=0}^{N2} h2(i1,i2)u[n-i1]u[n-i2] + \qquad (1)$$
$$\sum_{i1=0}^{N3}\sum_{i2=0}^{N3}\sum_{i3=0}^{N3} h3(i1,i2,i3)u[n-i1]\cdot u[n-i2]\cdot u[n-i3] + \dots$$

Here u[n] denotes the time-discrete linear transmitted signal at the sampling time n, which is passed to the filter, and y[n] denotes the signal correspondingly emitted by the filter at sampling times n·T, where T denotes the sampling interval and n denotes the sampling index. h0, h1, h2, h3 . . . are the corresponding coefficients of the filter. The first term in equation (1) defines a steady component (offset) and the second part defines a linear component of the non-linear filter. The values h1(i) define the impulse response of this linear component. The values h2(i1,i2), h3(i1,i2,i3) are in this connection also termed Volterra cores. The values N1,N2,N3 . . . are the so-called memory lengths of the respective Volterra cores and of the linear component.

For an exact modelling of the echo path it is now necessary to provide a filter of correspondingly higher order and/or with correspondingly longer memory lengths, which requires a large number of coefficients and thus a relatively high computational complexity in the calculation of the output signal of the filter. In addition this filter must—exactly like the actual echo path—in this connection normally be operated at the sampling frequency increased by the factor L in the present example, which likewise increases the computational complexity by the factor L. Accordingly, even with modern filters it is possible only with great difficulty to provide a real-time echo compensation with a high degree of accuracy in this way.

SUMMARY

One aspect of the present invention includes a method for creating a form of a non-linear filter suitable for reducing a computational complexity is proposed. The filter is resolved into polyphase components in such a way that the polyphase components can be interchanged with a conversion of the sampling rate of a signal to be sent to the filter or of a signal to be emitted by the filter. Corresponding filters and filter arrangements are also proposed. In this way, a computational complexity for calculating the signal to be emitted by the filter can be significantly simplified. The invention can be used in echo compensation.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 17A-17C illustrate diagrammatic process steps of a method according to one embodiment of the invention for reducing the computational complexity, in which
FIG. 17A represents an initial state, FIG. 17B an end state,
and FIG. 17C illustrates a simplified representation of the end state of FIG. 17B.
FIGS. 18A-18C illustrate diagrammatic process steps of a further method according to one embodiment of the invention for reducing the computational complexity in a filter circuit, in which
FIG. 18A represents an initial state, FIG. 18B an end state and FIG. 18C illustrated a simplified representation of the end state of FIG. 18B.
FIGS. 25A-25D illustrate polyphase implementations of an example for the filter arrangement from FIG. 16, in which
FIG. 25A represents the output circuit,
FIGS. 25B and 25C represent intermediate results,
and FIG. 25D represents the end result.
FIGS. 27A and 27B illustrate polyphase implementations of the filter arrangement illustrated in FIG. 26, in which
FIG. 27A represents an intermediate result and FIG. 27B represents an end result.

DETAILED DESCRIPTION

Figure 1:
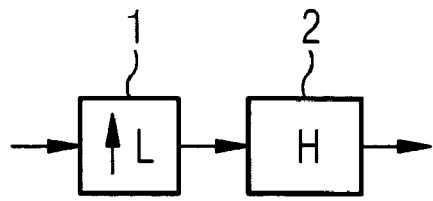
FIG. 1 is a block diagram of a first filter arrangement.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the present invention provides a method for filters, by means of which the computational complexity can be reduced. Furthermore, one embodiment of the present invention provides methods for simplifying filter arrangements that contain sampling rate converters.

Another embodiment of the present invention provides corresponding filters and filter arrangements. One embodiment of the present invention provides a system for echo compensation in which a good echo compensation can be achieved with a relatively low computational complexity.

According to one embodiment of the invention, in order to create a form of a non-linear Volterra filter that is suitable for reducing a computational complexity, it is proposed to resolve the Volterra filter into polyphase components in such a way that the polyphase components can be interchanged with a conversion of the sampling rate of a signal to be sent to the Volterra filter or of a signal to be emitted by the Volterra filter.

A form of a Volterra filter created by such a method permits digital filter arrangements to be designed in such a way that the calculations for determining an output quantity of the filter can be carried out at a relatively low sampling frequency. A computational complexity can thereby be reduced. The resolution into polyphase components is in this connection generally dependent on a factor by which the sampling rate is increased or decreased in the conversion.

To resolve the Volterra filter into polyphase components the resolution may be carried out separately according to homogeneous components of nth order according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1, z2, \ldots, zn)$ are the n-dimensional z-transform of the Volterra core of $n^{th}$ order, $Hn^{i1,i2,\ldots,in}(z^{1L}, z^{2L}, \ldots, zn^L)$ are the polyphase components, and L is the factor with which the conversion of the sampling rate is carried out.

In this connection $Hn^{i1,i2,\ldots,in}(z^{1L}, z^{2L}, \ldots, zn^L)$ may be calculated according to $$Hn^{i1,i2,\ldots,in}(z1^L, z2^L, \ldots, zn^L) =$$

$$\sum_{m1=0}^{N} \sum_{m2=0}^{N} \ldots \sum_{mn=0}^{N} hn[i1 + Lm1, i2 + Lm2, \ldots, in + Lmn]$$

$$z1^{-Lm1} z2^{-Lm2} \ldots zn^{-Lmn}$$

where hn is the Volterra core of nth order in time representation and N is a memory length of the Volterra core hn. If hn exists in triangular form, then correspondingly $Hn^{i1,i2,\ldots,in}(z^{1L}, z^{2L}, \ldots, zn^L)$ may also be calculated according to $$Hn^{i1,i2,\ldots,in}(z1^L, z2^L, \ldots, zn^L) =$$

$$\sum_{m1=0}^{N} \sum_{m2=m1}^{N} \ldots \sum_{mn=m(n-1)}^{N} hn[i1 + Lm1, i2 + Lm2, \ldots, in + Lmn]$$

$$z1^{-Lm1} z2^{-Lm2} \ldots zn^{-Lmn}$$

Filters resolved into polyphases in this way may be used to reduce the computational complexity in a circuit, in which a rate converter before the filter leads to the increase of the sampling rate.

For this purpose the Volterra filter is first of all resolved into polyphase components as described above. The order of the polyphase components and of the rate converter is then interchanged, in which connection a corresponding delay has to be taken into account for each of the polyphase components. By means of this measure the calculations of the individual polyphase components and subfilters can be performed at a lower sampling rate.

In the above method polyphase components that do not contribute to the output of the filter are eliminated. The following identity $$Hn(z1^L, z2^L, \ldots, zn^L) z1^{-k}, z2^{-k}, \ldots zn^{-k} = Hn(z1^L, z2^L, \ldots, zn^L) \oplus z^{-k}$$

can be used to determine the delays, in which the symbol $\oplus$ here denotes a sequential connection of the polyphase component with a delay element $z^{-k}$.

The case in which in a filter arrangement a sampling rate converter is arranged after such a Volterra filter in order to reduce the sampling rate of the signal to be emitted by the Volterra filter can also be handled in a similar way. In this case the result of the interchange is that the reduction of the sampling rate now takes place in front of the Volterra filter, so that the necessary computations by means of the polyphase components for the calculations of the signal to be emitted by the Volterra filter can be carried out at a lower sampling rate, thereby reducing the necessary computing time.

In the case where a sampling rate converter is arranged in front of as well as after the Volterra filter, a reduction of the sampling rate with which the calculations have to be carried out in the filter can likewise be achieved by corresponding interchanges.

A simpler non-linear filter arrangement may comprise a series connection of a first linear filter, a static non-linearity, and a second linear filter. The first and the second linear filters may be resolved into polyphase components, as described above for the general case of a non-linear Volterra filter, in order to be able to carry out interchanges with sampling rate converters. In this connection it should be noted that an interchange of a static non-linearity with a sampling rate converter is directly possible.

The method according to one embodiment of the invention may be used for example in the design of filter arrangements. In this connection a design software combination of sampling converters and non-linear filters for example can be handled automatically by the method according to the invention, so that these are correspondingly implemented. With a manual selection of appropriate filter arrangements the implementation of the method can likewise be automated. In the realisation of the filters with digital signal processors, these can also be designed in such a way that they independently carry out the method according to one embodiment of the invention with suitable filters, automatically or on request.

FIG. 1 illustrates a first filter arrangement, in which the method according to one embodiment of the invention and described hereinafter can be used to reduce a computational complexity. The term computational complexity is here basically understood to mean the number of individual calculations per unit time that are necessary in order to calculate an output signal of a filter or a filter arrangement. The filter arrangement illustrated in FIG. 1 includes a sampling rate converter 1 that raises a sampling rate of a signal fed to it by a factor L, and a non-linear Volterra filter 2 connected downstream of the sampling rate converter 1. The Volterra filter 2 operates at a sampling rate increased by the factor L, which correspondingly means an increased computational complexity.

Figure 2:
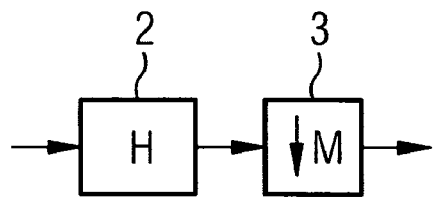
FIG. 2 is a block diagram of a second filter arrangement.

A second filter arrangement is illustrated in FIG. 2. Here the Volterra filter 2 is followed by a sampling rate converter 3, which reduces a sampling rate of the signal emitted by the Volterra filter 2 by a factor M. In this case the filter 2 operates at a sampling rate that is higher by a factor M than the part of the circuit following the sampling rate converter 3.

As previously indicated, the Volterra filter 2 may generally be represented by the equation:

$$y[n] = h0 + \sum_{i=0}^{N1} h1(i)u[n-i] + \sum_{i1=0}^{N2}\sum_{i2=0}^{N2} h2(i1, i2)u[n-i1]u[n-i2] + \sum_{i1=0}^{N3}\sum_{i2=0}^{N3}\sum_{i3=0}^{N3} h3(i1, i2, i3)u[n-i1]\cdot u[n-i2]\cdot u[n-i3] + ... \quad (1)$$

Here, u[n] denotes a time-discrete digital signal that is passed to the non-linear Volterra filter 2, and y[n] denotes the time-discrete and digital output signal of the Volterra filter 2, in each case at sampling times n·T, where T denotes a sampling interval and n denotes a sampling index. Digital signals in principle here also include so-called floating-point values. In this case floating point units with a corresponding computing power are required for the processing and calculation of the output values of the filter. The first term of equation (1) defines an offset h0 and the second term defines a linear component of the non-linear Volterra filter with coefficients h1(i), which represent the linear impulse response. The further terms of equation (1) describe the non-linear component, the values h2(i1,i2), h3(i1,i2,i3), . . . being termed Volterra cores of $2^{nd}$ order, $3^{rd}$ order, etc.

N1, N2 and N3 denote a length of a "memory" of the respective order.

A large class of non-linear transmission functions can be represented with the aid of such a Volterra filter. In practice the memory lengths N1,N2,N3, . . . as well as the order of the filter are restricted, which leads to corresponding restrictions.

It should be noted that equation (1) can also be regarded as the sum of the outputs of a plurality of filters, of a filter of $0^{th}$ order (offset), of a filter of $1^{st}$ order (linear component) with finite impulse response (FIR filter), of a filter of $2^{nd}$ order (third term on the right-hand side of equation (1)), etc. These filters may essentially be regarded independently of one another, since they can equally be realised as a parallel connection of the corresponding filters. Hereinafter mainly a homogeneous Volterra filter of $2^{nd}$ order will therefore be considered as an example, which is described by the following equation:

$$y[n] = \sum_{i1=0}^{N2}\sum_{i2=0}^{N2} h2(i1, i2)u[n-i1]u[n-i2] \quad (2)$$

An expansion to homogeneous Volterra filters of higher order may then be effected simply by corresponding summation over the further components i3, . . . . General Volterra filters may then in turn be represented as the sum of the various homogeneous components of $k^{th}$ order.

Figure 3:
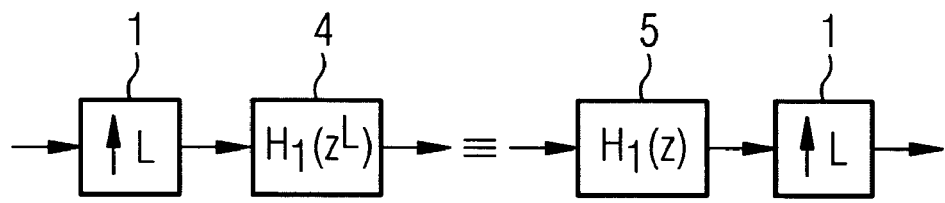
FIG. 3 illustrates a first identity for use in one embodiment of the present invention.
Figure 4:
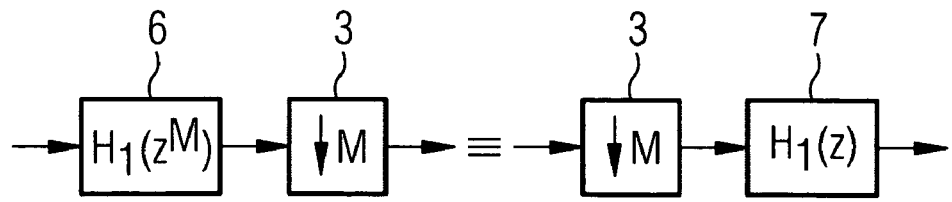
FIG. 4 illustrates a second identity.

For linear systems the identities represented in FIGS. 3 and 4 are known. FIG. 3 illustrates that a linear filter whose z-transform component of the coefficients h1 is given by $H1(z^L)$ can be interchanged with a sampling rate converter connected upstream of it, in which from the filter of the form $H1(z^L)$ the filter with the z-transform component becomes $H1(z)$. It should be noted here that $H1(z^L)$ is not a general linear filter since its impulse response and its coefficients h1[n] for N∤L, i∈$N_0$ are zero. $N_0$ denotes here the natural numbers including zero.

FIG. 4 illustrates a similar identity regarding the interchange of a linear filter of the form $H1(z^m)$ with a sampling rate converter 3 connected downstream, which reduces a sampling rate by a factor M. In this case the filter 6 of the form $H1(z^m)$ is replaced in the interchange by the filter 7 of the form $H1(z)$.

Such identities and possibilities for the interchange will be derived hereinafter for Volterra cores of higher order. As already explained, Volterra cores of $2^{nd}$ order are considered here as an example of this.

In order to translate the identities illustrated in FIGS. 3 and 4 to non-linear Volterra cores, the homogeneous Volterra filter of $2^{nd}$ order defined by the following equation will be considered:

$$y[n] = \sum_{m1=0}^{N}\sum_{m2=m1}^{N} h2(Lm1, Lm2)u[n-Lm1]u[n-Lm2] \quad (3)$$

This filter refers to the circuit illustrated in FIG. 1, and L again denotes the factor by which the sampling rate in front of the filter is increased. In the case of the filter defined by equation (3) it is assumed that the core h2 has a so-called triangular form, i.e. that h2(m1,m2) for $m2<m1$ is equal to zero, which is always possible from grounds of symmetry. Accordingly the second sum can begin at the index m2=m1. Equation (3) therefore describes a filter in which only the coefficients h2(Lm1,Lm2),m1,m2∈$N_0$ are not equal to zero.

The corresponding two-dimensional z-transform of this core h2 is given by:

$$H2(z1^L, z2^L) = \sum_{m1=0}^{N} \sum_{m2=m1}^{N} h2[Lm_1, Lm_2] z1^{-Lm_1} z2^{-Lm_2} \quad (4)$$

In this special system only $L^{th}$ powers of z1 and z2 occur.

The total core $H2(z1^L, z2^L)$ is according to equation (4) a linear combination of terms of the form $z1^{-Lm1} z2^{-Lm2}$. Accordingly the identities illustrated in FIGS. 5 and 6 will be shown for these terms.

Figure 5:
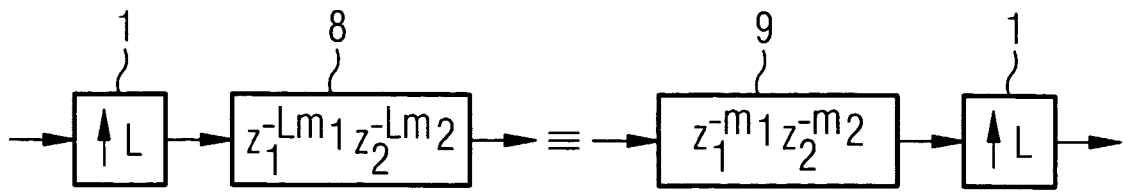
FIG. 5 illustrates a third identity.

The identity illustrated in FIG. 5 states that a sampling rate converter 1 with filter 8 connected downstream that includes the z-transform $z1^{-Lm1} z2^{-Lm2}$ is identical to a system with a filter 9 that includes the z-transform $z1^{-m1} z2^{-m2}$ and has a sampling rate converter 1 connected downstream. The identity illustrated in FIG. 6 states that a filter 10 with the z-transform $z1^{-Mm1} z2^{-Mm2}$ with sampling rate converter 3 connected downstream that reduces the sampling rate by the factor M, can be replaced by the sampling rate converter 3 with a filter 11 connected downstream that includes the z-transform $z1^{-m1} z2^{-m2}$. These identities are obvious if the transmission function of the filter defined by $z1^{-Lm1} z2^{-Lm2}$ is considered in the time period that is given by:

$$y_{m1,m2}[n] = u[n-Lm1] u[n-Lm2]$$

In this connection it should be noted that sampling rate converters 1 as illustrated in FIG. 1 and in FIG. 5 operate as so-called zero stuffers, that is, they insert between two input sampling values, L−1 sampling values with value 0 in order to increase the sampling rate.

Figure 6:
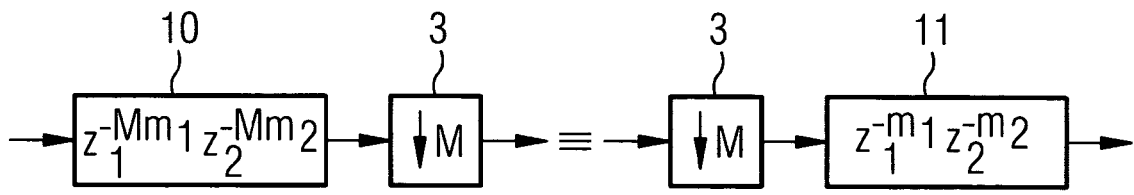
FIG. 6 illustrates a fourth identity.
Figure 7:
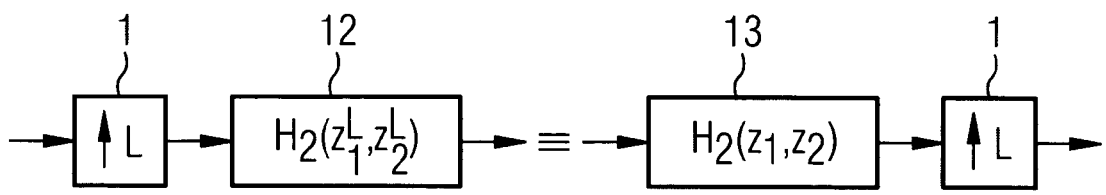
FIG. 7 illustrates a fifth identity.
Figure 8:
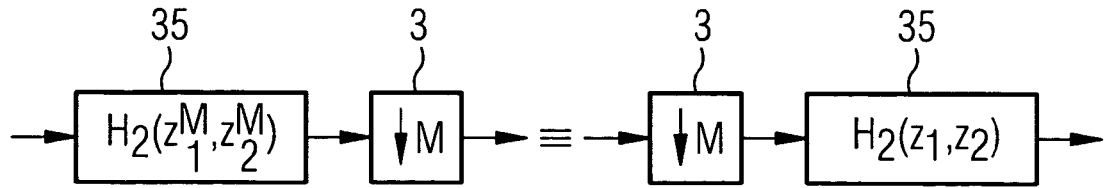
FIG. 8 illustrates a sixth identity.

Together with equation (4), the identities illustrated in FIGS. 5 and 6 produce the identities for special Volterra cores illustrated in FIGS. 7 and 8, which are defined as in equation (3).

The identity illustrated in FIG. 7 states in this connection that the sampling rate converter 1, which increases the sampling rate by the factor L, together with the filter 12 that is connected downstream, which is given by a z-transform of the form $H2(x1^L, z2^L)$, can be replaced by an arrangement with a filter 13 which is given by the z-transform $H2(z1, z2)$, with the sampling rate converter 1 connected downstream. FIG. 8 illustrates a corresponding identity for the case of a sampling rate converter 3 connected downstream, which reduces the sampling rate by a factor M. Here a filter 35, which is given by the z-transform $H2(z1^M, z2^M)$, together with sampling rate converter 3 connected downstream, can be replaced by the sampling rate converter 3 with filter 35 connected downstream, which includes the z-transform $H2(z1,z2)$.

Next, two further identities that are required in what follows will be shown. The "zero identity" illustrated in FIG. 9 applies only for k1Ik2, k1,k2∈ {0,1, . . . ,L−1}. In this connection it should be noted that for values of k1 and k2>L−1, the respective value can be split into a multiple of L and a value that satisfies the above condition, in other words:

$$k1 = rL + \overline{k1}; \; r \epsilon N \text{ und } \overline{k1} \epsilon \{0,1,\ldots,L-1\} \quad (5),$$

a similar formula also applies for k2. N in this connection represents the natural numbers excluding 0.

In this case the term $z1^{-rL}$ can then be combined with the term $H2(z1^L, z2^L)$.

Figure 9:
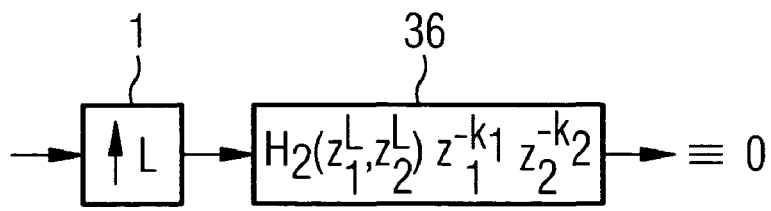
FIG. 9 illustrates a seventh identity.

The identity illustrated in FIG. 9 states specifically that the output of a filter arrangement that consists of a sampling rate converter 1 that increased the sampling rate by the factor L, and a filter 36 which is defined by the z-transform $H2(z1^L, z2^L) z1^{-k1} z2^{-k2}$ with k1 and k2 as defined above, is always 0.

This identity in turn becomes clear if the representation is considered in the time period according to:

$$y[n] = \sum_{m1=0}^{N} \sum_{m2=m1}^{N} h2(Lm1+k1, Lm2+k2) \cdot u[n-Lm1-k1] u[n-Lm2-k2] \quad (6)$$

Since, as described above, the sampling rate converter 1 inserts L−1 zeros between two sampling values fed to it, only the input values of the filter u[nL]≠0, so that with the condition stated above for k1 and k2 the product u[n−Lm1−k1]u[n−Lm2−k2] is always zero.

Figure 10:
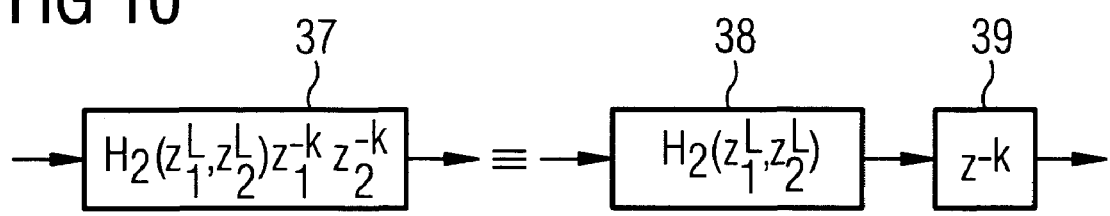
FIG. 10 illustrates an eighth identity.

Furthermore the identity illustrated in FIG. 10 is used hereinafter, which can be described as "extracting a delay". This identity states that a filter 37 that is given by the z-transform $H2(z1^L, z2^L) z1^{-k} z2^{-k}$, can be replaced by a filter 38 with the z-transform $H2(z1^L, z2^L)$ followed by a delay element of k sampling values 39, whose z-transform is $z^{-k}$.

Next, the procedure described above for resolving a general homogeneous Volterra core of $2^{nd}$ order into polyphase components will be used, wherein the polyphase components per se should permit the interchange operations illustrated in FIGS. 7 and 8. The general z-transform of such a core is:

$$H2(z1, z2) = \sum_{m1=0}^{N} \sum_{m2=m1}^{N} h2(m1, m2) z1^{-m1} z2^{-m2} \quad (7)$$

where h2 is the Volterra core of $2^{nd}$ order from equation (1), which again exists in triangular form. Accordingly the second sum can start at m2=m1. This core H2 in z-representation will now be resolved into terms of the form $H2(z1^L, z2^L)$. The desired resolution may be described by the following equation:

$$H2(z1, z2) = \sum_{i=0}^{L-1} \sum_{j=0}^{L-1} H2^{ij}(z1^L, z2^L) z1^{-i} z2^{-j} \quad (8)$$

$H2^{ij}(z1^L, z2^L)$ is in this connection the z-transform of special $2^{nd}$ order "sub-cores", of the so-called polyphase components:

$$H2^{ij}(z1^L, z2^L) = \sum_{m1=0}^{N} \sum_{m2=m1}^{N} h2(i+Lm1, j+Lm2) z1^{-Lm1} z2^{-Lm2} \quad (9)$$

Equations (8) and (9) apply to the case of the filter arrangement of FIG. 1. For the filter arrangement of FIG. 2 "L" simply has to be replaced by "M".

As an example, a Volterra core that is given by the matrix:

$$H2 = \begin{bmatrix} 1 & 2 & 3 & 4 & 5 \\ 0 & 6 & 7 & 8 & 9 \\ 0 & 0 & 10 & 11 & 12 \\ 0 & 0 & 0 & 13 & 14 \\ 0 & 0 & 0 & 0 & 15 \end{bmatrix} \quad (10)$$

will be considered. For L=2 this matrix has to be resolved into four sub-matrices that satisfy equation (8), in other words:

$$H2(z1,z2)=H2^{00}(z1^2,z2^2)+H2^{01}(z1^2,z2^2)z2^{-1}++H2^{10}(z1^2,z2^2)z1^{-1}+H2^{11}(z1^2,z2^2)z1^{-1}z2^{-1} \quad (11)$$

With equation (9) the sub-matrices to:

$$H2^{00} = \begin{bmatrix} 1 & 3 & 5 \\ 0 & 10 & 12 \\ 0 & 0 & 15 \end{bmatrix}, H2^{01} = \begin{bmatrix} 2 & 4 \\ 0 & 11 \end{bmatrix}, \quad (12)$$

$$H2^{10} = \begin{bmatrix} 0 & 7 & 9 \\ 0 & 0 & 14 \\ 0 & 0 & 0 \end{bmatrix}, H2^{11} = \begin{bmatrix} 6 & 8 \\ 0 & 13 \end{bmatrix}$$

are obtained.

As can be seen, the left-hand upper element of each sub-matrix corresponds to that element of the matrix from equation (10) that is given by the indices ij of the notation $H2^{ij}$ of the respective sub-matrix. In addition it can be seen that, starting from this "start element", each second element of the matrix from equation (10) is deleted, which in this case with L=2 is also evident from equation (9).

If in this connection matrices such as $H2^{10}$ arise, in which whole rows and/or columns contain only zero values, these columns and/or rows are disregarded in the implementation and only a correspondingly reduced matrix is implemented.

It will now be shown hereinafter how the realisation form of the filter given by equation (8) can be used to reduce a computational complexity in a circuit such as in FIG. 1 or FIG. 2. In this connection different special features have to be considered in the cases of FIG. 1 and FIG. 2, and accordingly these cases will be dealt with separately in the following description.

Figure 11:
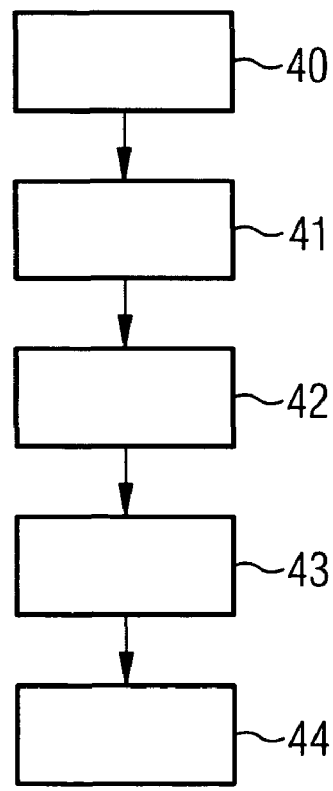
FIG. 11 illustrates a flow diagram of a method according to one embodiment of the invention for reducing the computational complexity in a filter arrangement.
Figure 12A:
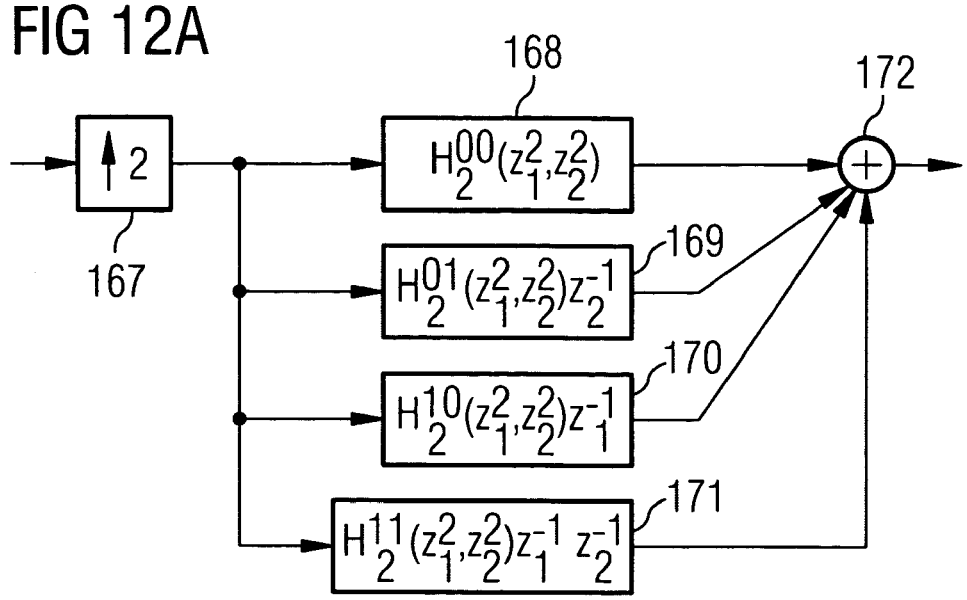
FIGS. 12A-12C illustrate filter arrangements according to individual processor steps of FIG. 11.
Figure 12B:
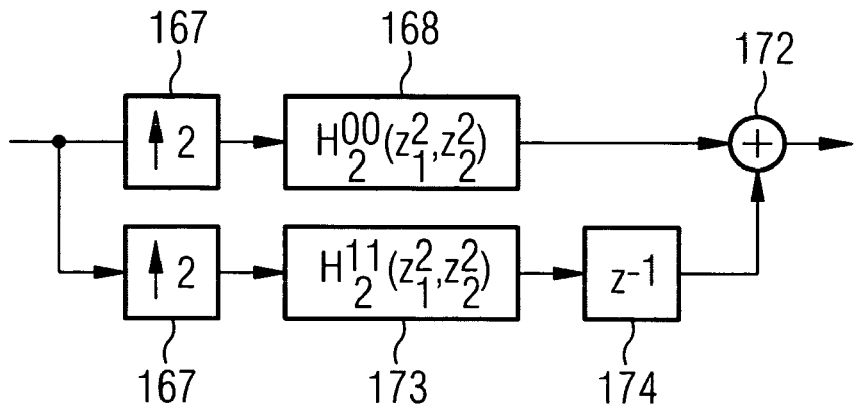
Figure 12C:
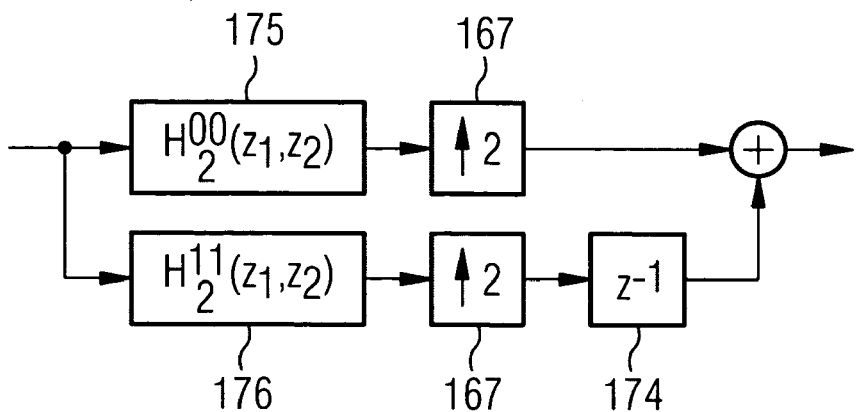

FIG. 11 illustrates a flow diagram of the method for reducing a computational complexity in the filter arrangement of FIG. 1. FIGS. 12A-12C illustrate results of individual process steps for the example with L=2 handled above corresponding to equations (10) to (12).

In a first step 40 the Volterra core is resolved corresponding to equations (8) and (9). This yields for the illustrated example the filter arrangement illustrated in FIG. 12A, in which the sampling rate converter 1 from FIG. 1 now corresponds to a sampling rate converter 167 that doubles the sampling rate. The filter includes four parallel branches with polyphase components and subfilters 168-171, which operate according to the sub-matrices of equation (12) and whose outputs are summated with an adder 172. In step 41 the sampling rate converter 167 is resolved in all parallel branches of the filter, in other words in the example of 12A the sampling rate converter 167 is "quadrupled" and placed in front of each of the subfilters 168-171.

In step 42 the zero identity from FIG. 9 is used in order to remove those subfilters and polyphase components that do not contribute to the output signal of the filter. According to the identity from FIG. 9 these are in particular those in which in the term $z1^i z2^j$ i and j are not equal. In the present example from FIG. 12A, these are the filters 169 and 170.

In step 43 delay elements are extracted from the subfilters. For this purpose the identity illustrated in FIG. 10 is used. In the present example this is possible for the subfilter 171. After this step the situation of FIG. 12B exists. The subfilters 169 and 170 are removed, and the subfilter 171 was split into the subfilter 173 and the delay element 174.

In a last step 44 the sampling rate converters and the subfilters are interchanged using the identity from FIG. 7, whereby the exponents L in the z-transform of the subfilters "disappear" since the filters now still operate only at the sampling rate not increased by the factor L. This leads to the result illustrated in FIG. 12C. Subfilter 168 became subfilter 175, which differs from the subfilter 168 merely by the missing exponent "2", and subfilter 173 correspondingly became subfilter 176. Compared to the output state of FIG. 1 and FIG. 12A the necessary computational complexity for the filter has been significantly reduced. On the one hand the necessary calculations in the illustrated example only still have to be carried out at half the sampling rate or half the rate frequency, and on the other hand by using the zero identity from FIG. 9 two filters or polyphase components could be completely removed, which means a further reduction of the computational complexity. In general the number of computing operations per unit time can be reduced by a factor of $L^2$ by the aforedescribed method, since the use of the zero identity from FIG. 9, as well as the calculation at a lower sampling rate, in each case produces a saving by a factor of L.

A corresponding method for the case of FIG. 2 will next be illustrated, in other words the case in which a non-linear Volterra filter 2 is followed by a sampling rate converter 3 that reduces the sampling rate by a factor M. In this case too an interchange of the filter with the sampling rate converter 3 is desirable since the filter 2 can then operate at a correspondingly lower sampling rate.

In principle the resolution into polyphases as described by equations (8) and (9) is used for this case too. It should however be noted that in the case of FIG. 2 no zero identity like that illustrated in FIG. 9 exists. Accordingly the terms:

$$H2^{ij}(z1^M, z2^M)z1^{-i}z2^{-j} \quad (13)$$

for i ≠ j do not disappear. These terms also cannot be interchanged with the sampling rate converter 3 by means of the identity from FIG. 8. Further considerations are therefore necessary here.

In order to deal with this problem, the Volterra filter is regarded as a bilinear Volterra operator H2{u1,u2}:

$$y[n] = H2\{u1, u2\} \quad (14)$$

$$= \sum_{m1=0}^{N} \sum_{m2=m1}^{N} h2(m1, m2) u1[n-m1] u2[n-m2]$$

Equation (14) substantially corresponds to equation (2). This system includes two inputs u1 and u2 and can be regarded as a linear filter, in particular as a filter with a finite impulse response, FIR, if one of the inputs u1 or u2 is maintained constant. The corresponding two-dimensional z-transform of the core h2 from equation (14) is given by:

$$H2(z1, z2) = \sum_{m1=0}^{N} \sum_{m2=m1}^{N} h2(m1, m2) z1^{-m1} z2^{-m2}$$

In order now to be able to process further the expression from formula (13) for i ≠ j, the delays $z1^{-i}$ and $z2^{-j}$ are shifted to the inputs u1, u2 of the bilinear system.

The identity from FIG. 8 can then be used to interchange the term $H2^{ij}(z1^m, z2^m)$ and the sampling rate converter.

Figure 13:
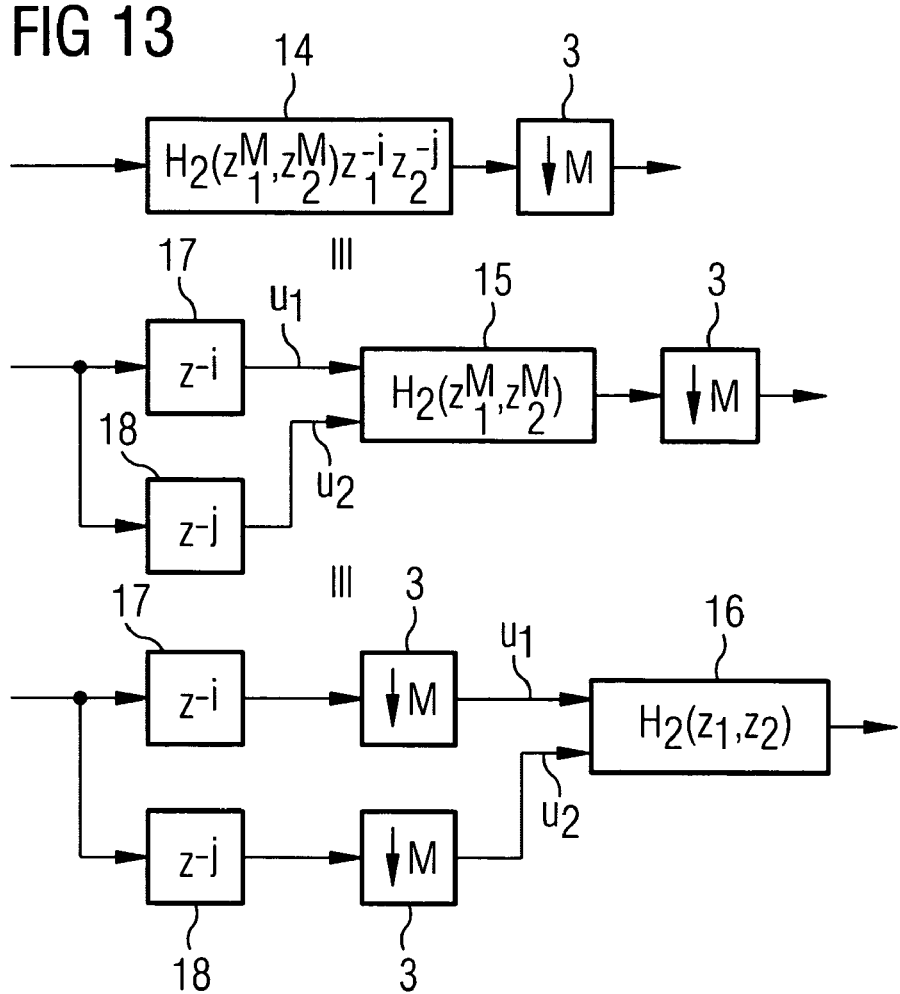
FIG. 13 illustrates a ninth identity.

This method and this identity are illustrated in FIG. 13. The initial situation is a filter 14 with a z-transform according to equation (13) with a sampling rate converter 3 connected downstream (top line). According to the above discussion, this filter arrangement is equivalent to the filter arrangement illustrated in the middle line, in which the delays have been displaced to the two inputs u1 and u2. Delay element 17 with the z-transform $z^{-i}$ has been displaced to the u1 input of a filter 15, and delay element 18 with the z-transform $z^{-j}$ has been displaced to a u2 input of the filter 15. Compared to the filter 14, the filter 15 now accordingly includes the z-transform $H2(z1^M, z2^M)$. Finally, in the bottommost line in FIG. 13 the filter 15 has been interchanged with the sampling rate converter 3, the sampling rate converter 3 now being arranged in each of the two input branches of the filter 16, which corresponds to the filter 15 without the exponents "M".

Figure 14:
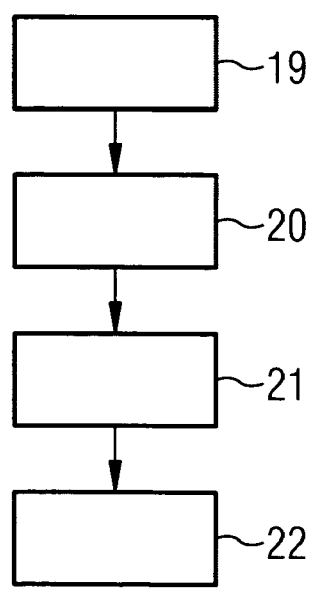
FIG. 14 illustrates a flow diagram of a further method for reducing the computational complexity in a filter arrangement.
Figure 15A:
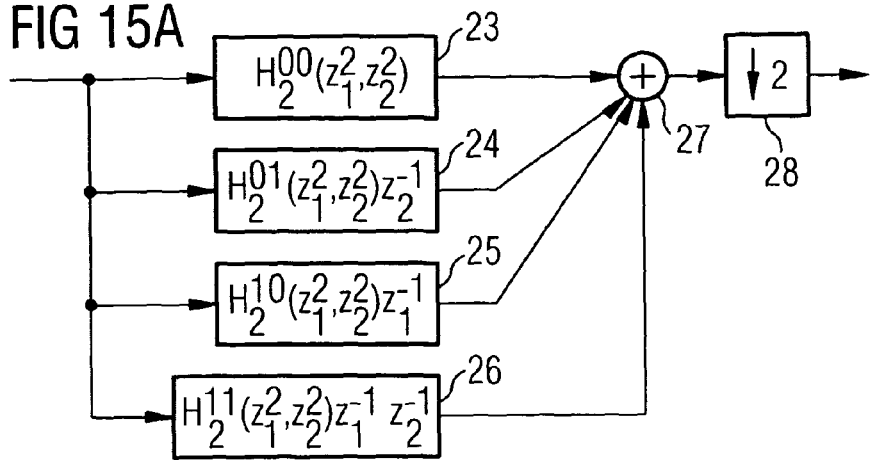
FIGS. 15A-15C illustrate filter arrangements according to individual process steps of FIG. 14.
Figure 15B:
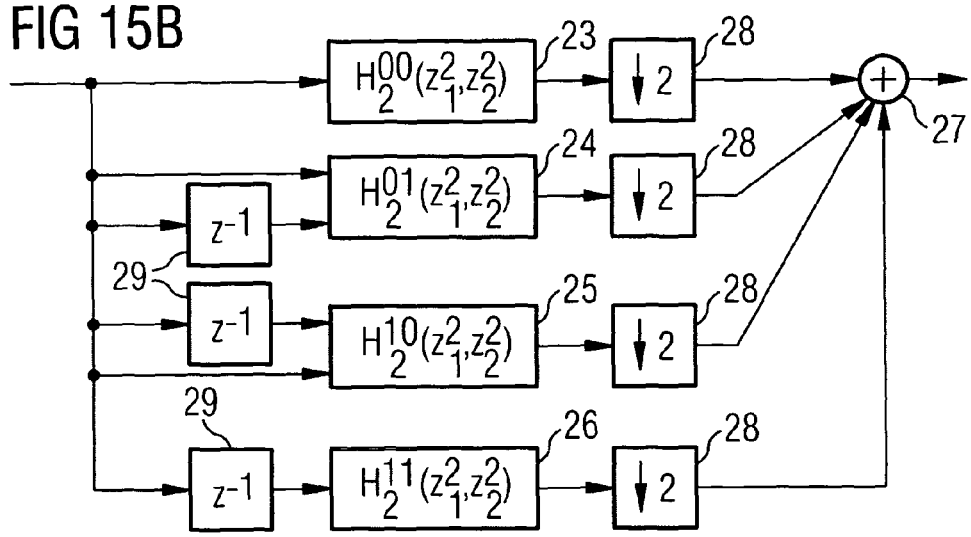
Figure 15C:
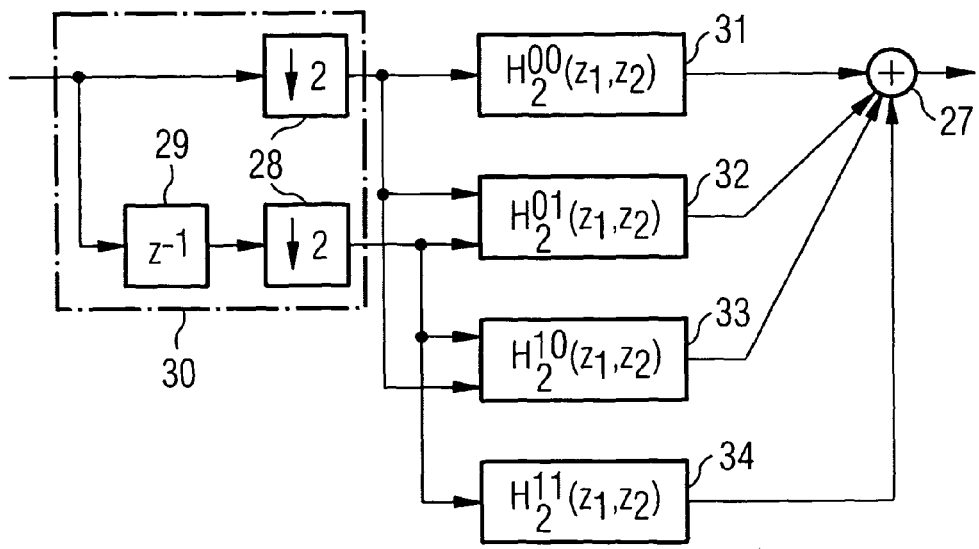

By means of this identity illustrated in FIG. 13 it is now possible to apply also to the filter arrangement illustrated in FIG. 2, a similar process as that described with reference to FIG. 11 for the filter arrangement of FIG. 1, in order to reduce the necessary computational complexity in the operation of the filter arrangement of FIG. 2. A flow diagram of this method is illustrated in FIG. 14. FIGS. 15A-15C illustrate by way of example the structure of the filter arrangement according to the individual process steps, in which the filter with M=2 discussed with reference to equations (10) to (12) is again basically used.

In a first step 19 the Volterra filter and the Volterra core are resolved into polyphase components in a similar way to step 40 in FIG. 11, using equations (8) and (9). This gives for the present example, similarly to FIG. 12A, the filter illustrated in FIG. 15A with four polyphase components and subfilters 23-26 connected in parallel, whose outputs are summated with an adder 27. A sampling rate converter 28 is connected downstream, which reduces the sampling rate of the signal fed to it by a factor of 2.

In step 20 of FIG. 14 the sampling rate converter 28 is displaced to each of the parallel branches of the filter, which is equivalent to interchanging the adder 27 with the sampling rate converter 28.

In step 21 the delay terms contained in the z-transform of the subfilters 23-26 are shifted to the inputs of the subfilters, for which purpose there is used either the identity illustrated in FIG. 10 or the identity illustrated in FIG. 13. The identity illustrated in FIG. 10 is used if the exponents of the delay terms are equal. The identity illustrated in FIG. 13 is used if the exponents are different. The result for the illustrated example is illustrated in FIG. 15B. In particular the identity from FIG. 10 was used in the case of the subfilter 26, while the identity from FIG. 13 was used in the case of the subfilters 24 and 25. The result of this is that the subfilters 24 and 25 now in each case comprise inputs with different delays.

In a last step 22 the identity from FIG. 8 is used in order to interchange the sampling rate converters with the subfilters. Moreover identical delay elements may be combined here. The result for the example is illustrated in FIG. 15C. The subfilters with "deleted" exponents M, now identified as 31-34, are now arranged behind the sampling rate converters 28 so that they still only have to operate at half the sampling frequency, which correspondingly reduces the computational complexity. The input branches have been combined in such a way that only one delay element 29 is still necessary. By using a commutator that rotates in a clockwise direction, the block 30 identified by the chain-dotted line could be simplified still further.

As can be seen, a computational complexity can be reduced by the method according to one embodiment of the invention also for the case of FIG. 2. The computational complexity is here reduced approximately by a factor M. In contrast to the case of FIG. 1, no coefficients or polyphase components of the original non-linear filter can be deleted, so that the reduction of the computational complexity is based just on the calculation at a lower sampling frequency.

The method according to one embodiment of the invention has been illustrated by the example of a homogeneous Volterra core of $2^{nd}$ order. An expansion to non-linear Volterra filters of arbitrary dimension is possible in a simple way. As already explained, the mathematical relationship illustrated in equation (1) can be regarded as a parallel circuit of homogeneous Volterra cores of different orders. Accordingly, each homogeneous Volterra core of $n^{th}$ order can be treated separately. For an order higher than 2 the illustrated equations now simply have to be appropriately expanded, so that summation is performed over several dimensions. The general form of equation (8) is then for example:

$$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in} \quad (15)$$

The general form of equation (9) is correspondingly:

$$Hn^{i1,i2,\ldots,in}(z1^L, z2^L, \ldots, zn^L) = \sum_{m1=0}^{N} \sum_{m2=0}^{N} \ldots \sum_{mn=0}^{N} hn[i1 + Lm1, i2 + Lm2, \ldots, in + Lmn] \cdot z$$

$$1^{-Lm1} z2^{-Lm2} \ldots zn^{-Lmn} \quad (16)$$

In order to derive an identity corresponding to FIG. 13, a linear form with more than two inputs is considered, of which in each case all except one input are regarded as constant. Delay terms connected downstream can then in turn correspondingly be displaced as delay elements to the individual inputs of the linear form. It is therefore clearly evident that the concept illustrated above can be applied in a simple way to arbitrary Volterra filters.

Figure 16:
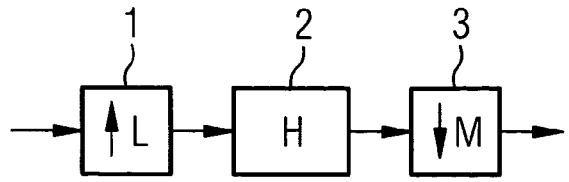
FIG. 16 illustrates a block diagram of a third filter arrangement, whose computational complexity is to be reduced by means of one embodiment of the present invention.

The more general case of a third filter arrangement, such as is illustrated in FIG. 16, will now be discussed. In this case a non-linear Volterra filter 2 is arranged between a sampling rate converter 1 that raises a sampling rate of a signal passed to it by a factor L, and a sampling rate converter 3 that reduces a sampling rate by a factor M. This filter arrangement will now be modified so that a computational complexity is minimised as far as possible.

For this purpose the previously determined results are used. To this end filter arrangements corresponding to FIG. 12C and FIG. 15C will now be illustrated for the general case of arbitrary values of L and M. The discussion is again based on a homogeneous Volterra core of $2^{nd}$ order, and a generalisation to general Volterra filters is possible in a simple way as described above.

Figure 17A:
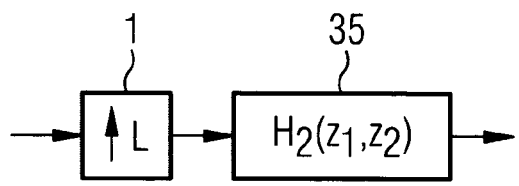
Figure 17B:
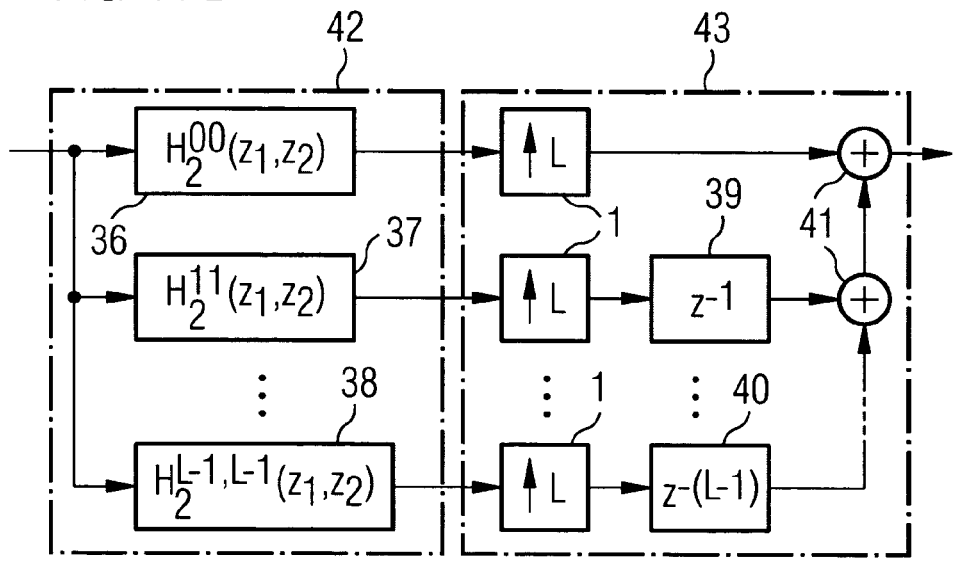

FIG. 17A illustrates a combination of the sampling rate converter 1 and a homogeneous Volterra filter of $2^{nd}$ order 35 that is characterised by the z-transform $H2(z1,z2)$. As has already been discussed in detail, this filter can be converted into the arrangement illustrated in FIG. 17B. In this connection all polyphase components with i ‡ j do not contribute to the output of the filter, with the result that only the polyphase components 36-38 $H2^{00}, H2^{11}, \ldots H2^{L-1,L-1}$ remain, as is illustrated in FIG. 17B. FIG. 17B otherwise substantially corresponds to the already described FIG. 12C for a general sampling rate conversion by the factor L. The sampling rate converter 1 now lies behind the polyphase components 36-38, so that these operate with a lower sampling rate. The outputs of the filter paths with different delay elements 39, 40 are summated in adders 41.

Figure 17C:
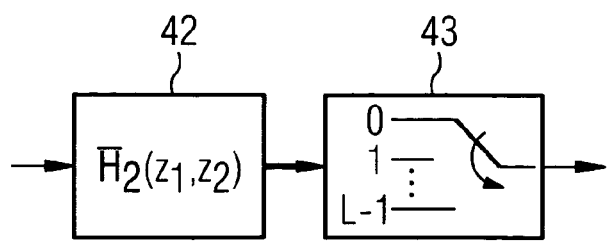

FIG. 17C illustrates a simplified representation of the filter arrangement of FIG. 17B, in which the circuit blocks framed by chain-dotted lines and identified as 42 and 43 in FIG. 17B have been combined into a circuit block 42 and a circuit block 43. The circuit block 42 includes the polyphase components 36-38 from FIG. 17B, which are identified here briefly as $\overline{H2}(z1,z2)$. The upper bar is intended to denote that only the L components $H2^{ii}(z1,z2)$, $0 \leq i \leq L-1$ occur in the polyphase implementation.

Figure 18A:
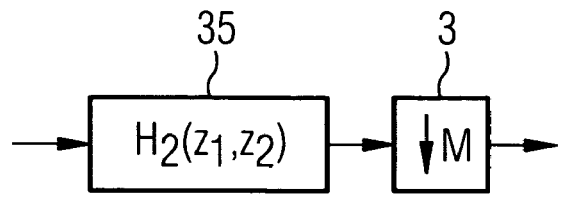
Figure 18B:
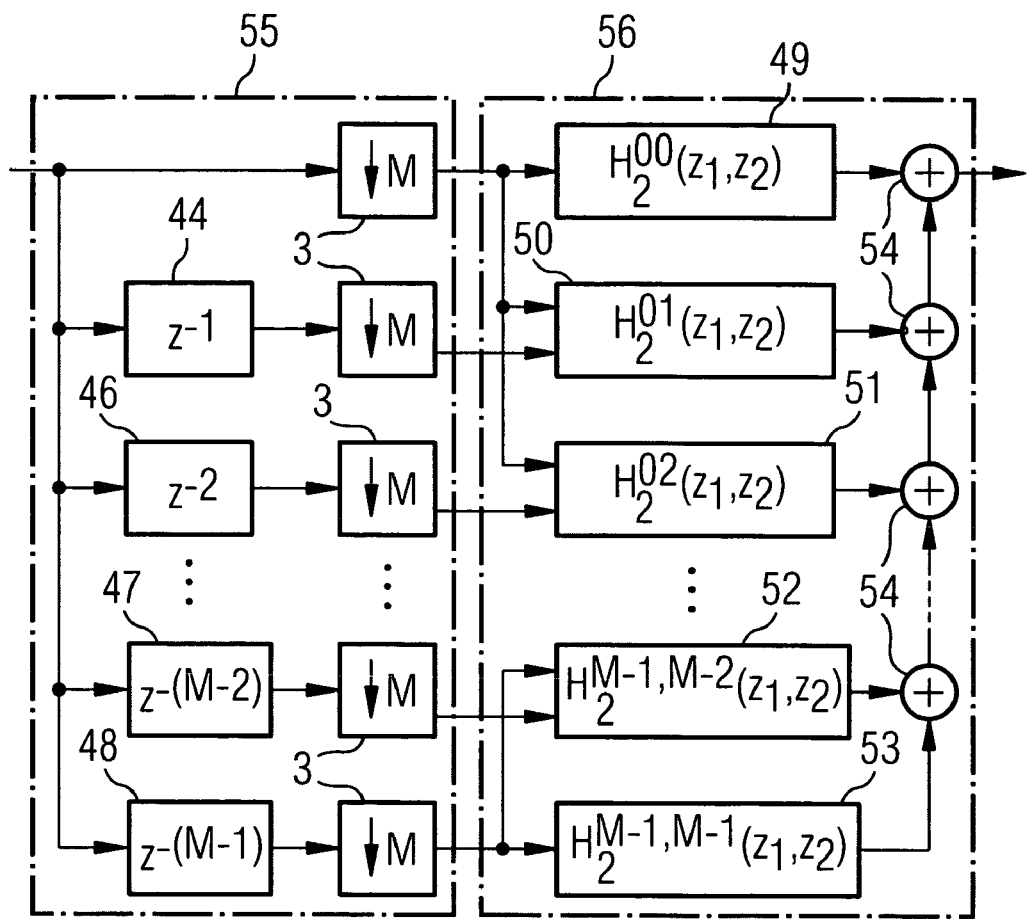
Figure 18C:
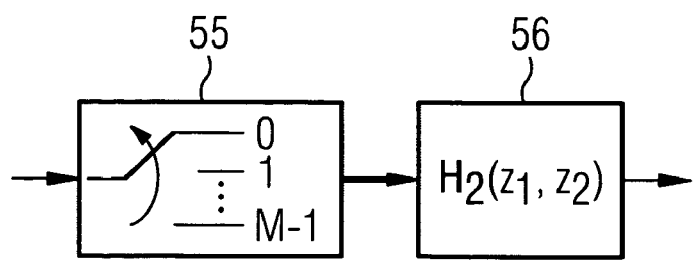

The corresponding application of the method to the circuit illustrated in FIG. 18A, in which the sampling rate converter 3 follows the filter 35, is illustrated in FIGS. 18A-18C. The application of the described method leads here to the filter arrangement illustrated in FIG. 18B. It should be noted here that, on account of the absence of a zero identity, all polyphase components 49-53 with the z-transform $H2^{ij}(z1, z2)$ are present. The components with i ‡ j have two inputs, to which are passed input signals variously delayed by delay elements 44-48. The outputs of all filter branches are summated by adders 54. In FIG. 18C a summarised representation of FIG. 18B is again illustrated, in which all polyphase components are combined into a block 56 and the remaining components are combined into a block 55. The "summarised" z-transform H2(z1,z2) is in this case not blocked out since all polyphase components are present.

Figure 19:
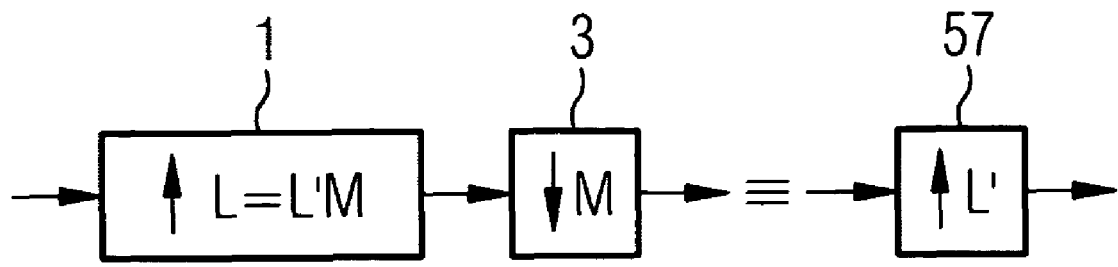
FIG. 19 illustrates a first identity for sampling rate converters.

Possible ways in which a succession of sampling rate converters can be combined and simplified will now be shown. FIG. 19 illustrates the case where a sampling rate converter 1 that increases the sampling rate by the factor L, is followed by a sampling rate converter 3 that reduces the sampling rate by the factor M, where L is a multiple of M, and L=L'·M. In this case the sampling rate converter 1 and the sampling rate converter 3 can be replaced by a single sampling rate converter 57, which increases the sampling rate by the factor L'.

Figure 20:
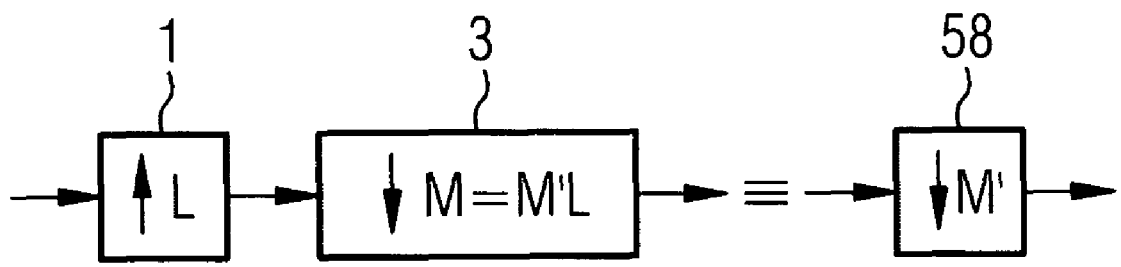
FIG. 20 illustrates a second identity for sampling rate converters.

A similar identity is illustrated in FIG. 20. In contrast to the case illustrated in FIG. 19, here the factor M is a multiple of the factor L, and M=M'·L. In this case the sequence of the sampling rate converters 1 and 3 can be replaced by one sampling rate converter 58, which reduces the sampling rate by the factor M'.

Figure 21:
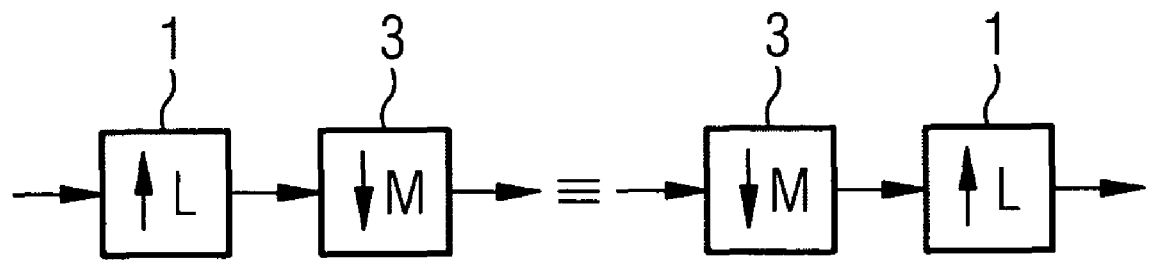
FIG. 21 illustrates a third identity for sampling rate converters.

A third identity is illustrated in FIG. 21. In the case illustrated in FIG. 21 the factors L and M are relatively prime. In this case the sampling rate converter 1 and the sampling rate converter 3 can be interchanged.

In the ways illustrated hereinafter for reducing the computational complexity in the filter arrangement of FIG. 16, the identities illustrated in FIGS. 22A-22E are still required. The identity illustrated in FIG. 22A corresponds to the case of FIG. 19, where a filter or delay element 59 with the z-transform $z^{-kM}$ is still arranged between the sampling rate converter 1 and the sampling rate converter 3. This system is identical to a sampling rate converter 57 that increases the sampling rate by the factor L', followed by a delay element 60 with the z-transform $z^{-k}$, where k is a whole number.

Figure 22A:
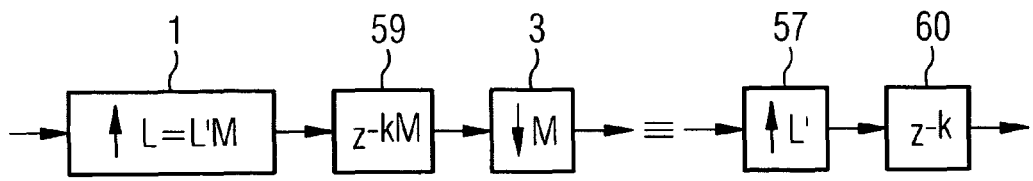
FIGS. 22A-22E illustrate identities for sampling rate converters in conjunction with delay elements.
Figure 22B:
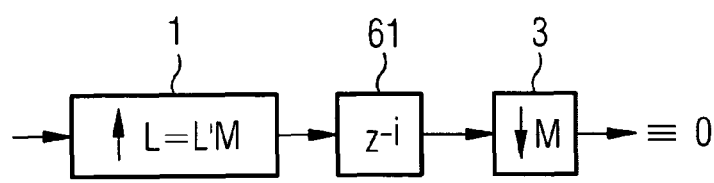

A similar arrangement is illustrated in FIG. 22B, in which instead of the filter 59 a filter 61 in the form of a delay element of the form $z^{-i}$ is arranged between the sampling rate converter 1 and the sampling rate converter 3. i is in this case not a multiple of M(i‡k·M, where k is an integer number). In this case the output of the filter arrangement is always zero.

Figure 22C:
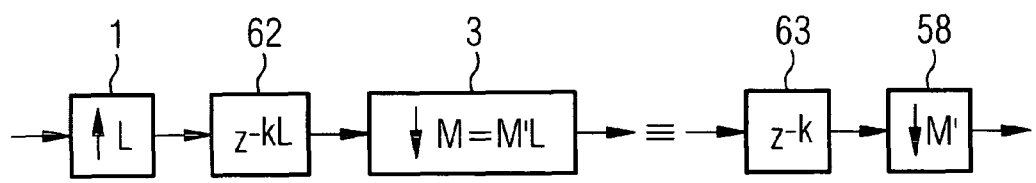

An identity similar to the identity of FIG. 22A for a case corresponding to FIG. 20 is illustrated in FIG. 22C, in which the factor M of the sampling rate converter 3 is a multiple of the factor L of the sampling rate converter 1. A filter 62 of the form $z^{-kL}$ is arranged between the sampling rate converter 1 and the sampling rate converter 3. This arrangement is equivalent to an arrangement with a delay element 63 of the form $z^{-k}$, followed by a sampling rate converter 58 from FIG. 20 with a factor M'.

Figure 22D:
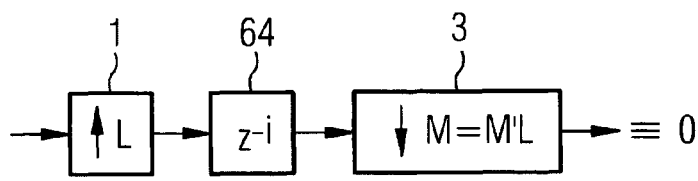

FIG. 22D illustrates the case in which between the sampling rate converter 1 and the sampling rate converter 3 there is arranged not a filter 62 of the form $z^{-kL}$, but instead a filter 64 of the form $z^{-i}$ where i ‡ k·L. Similarly to the case of FIG. 22B, such a filter arrangement always has a zero output.

Figure 22E:
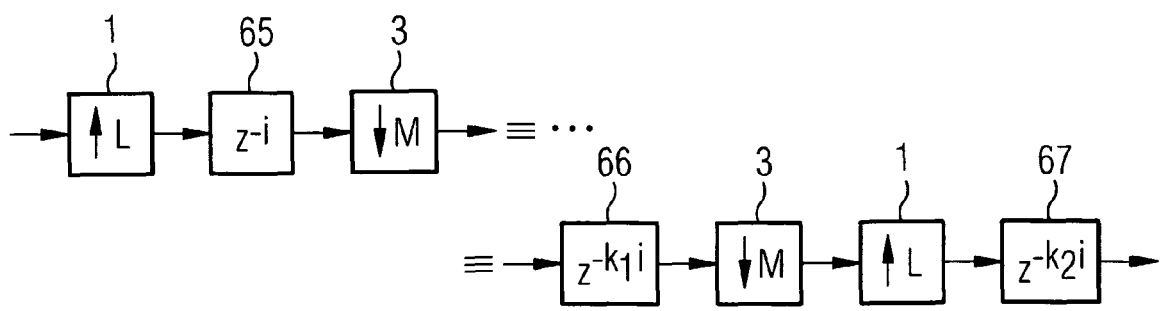

Finally a case corresponding to FIG. 21 is arranged in FIG. 22E, in which the factor L and the factor M are relatively prime. In the filter arrangement of 22E a filter 65 of the form $z^{-i}$, where i ‡ k·L and i ‡ k·M where k is a whole number, is arranged between the sampling rate converter 1 and the sampling rate converter 3. Equivalent to this arrangement is an arrangement with a filter 66, the sampling rate converter 3, the sampling rate converter 1 and a filter 67 in this order, in which the filter 66 includes the z-transform $z^{-k1i}$ and the filter 67 includes the z-transform $z^{-k2i}$. k1 and k2 are in this connection whole numbers.

Corresponding to the identities illustrated in FIGS. 19-22E, three cases may be distinguished for the simplification of the filter arrangement illustrated in FIG. 16:

In the first case L is a multiple of M (L=L'·M).

Figure 23A:
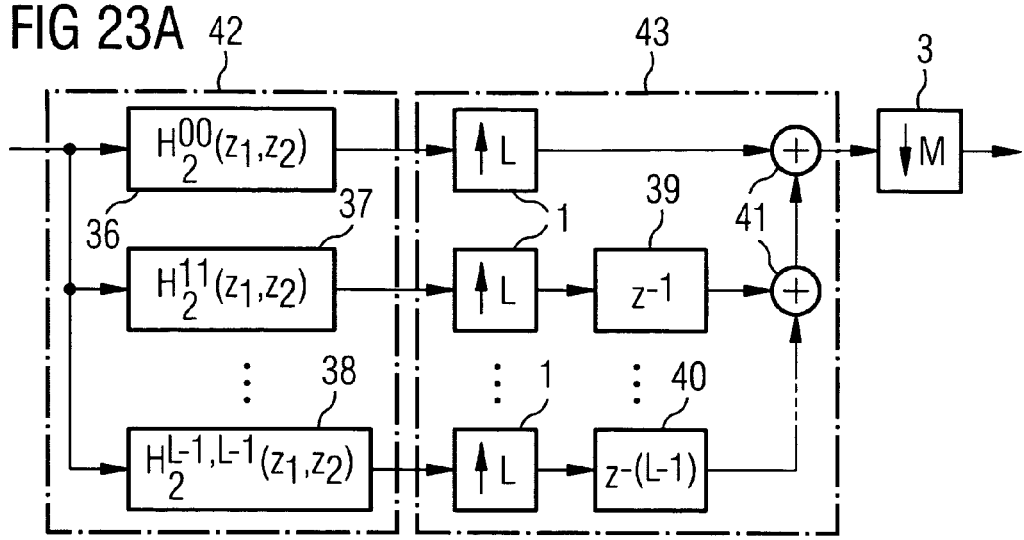
FIGS. 23A and 23B illustrate filter arrangements for illustrating a method according to one embodiment of the invention for reducing the computing time of filter arrangements.

In this case the output sampling rate of the filter arrangement is greater than the input sampling rate. It is therefore advantageous to interchange the sampling rate converter 1 from FIG. 16 with the filter 2, so that the filter operates at the low input sampling rate. First of all, to this end the polyphase resolution and interchange illustrated in FIG. 17B is employed corresponding to the method already described with reference to FIG. 11. This leads to the filter arrangement illustrated in FIG. 23.

The identities illustrated in FIGS. 19, 22A and 22B are then used to interchange the delay elements 39-40 with the sampling rate converter 3 as well as to combine the sampling rate converter 1 with the sampling rate converter 3.

Figure 23B:
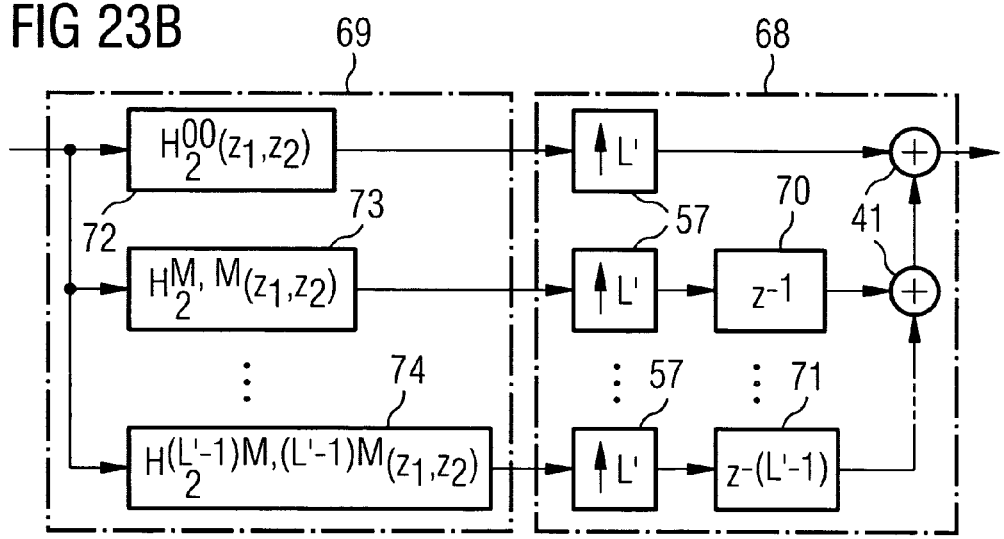

The end result is illustrated in FIG. 23B. In this realisation only L' polyphase components 72-74 still occur in the block 69. A further reduction of the computational complexity is thereby achieved. Also, a saving in sampling rate converters is achieved by combining the sampling rate converter 1 and the sampling rate converter 3 into the sampling rate converters 57. It should be noted that for the simple case L=M (L'=1) only the first polyphase component 72 from FIG. 23B contributes to the output, so that for this case the filter arrangement illustrated in FIG. 23B can be simplified still further.

In the second case M is a multiple of L (M=M'·L).

Also in this case it is advantageous to interchange the sampling rate converter 1 from FIG. 1 with the Volterra filter 2. As in the first case, the already described method is employed in order to achieve the result of FIG. 23A. The identity illustrated in FIG. 22D is now used in order to extinguish all branches that contain a delay element, i.e. in FIG. 23A all branches except the top one, since these contain delay elements 39-40. This is possible since the exponents of all these delay elements are not a multiple of L and the condition set for the identity of FIG. 22D, namely M=M'·L, is satisfied for the second case. Then, according to the identity of FIG. 20 the sampling rate converter 1 can be fused with the sampling rate converter 3 to form a single sampling rate converter 58. The result is illustrated in FIG. 24A.

Figure 24A:
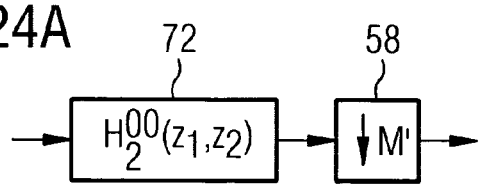
FIGS. 24A and 24B illustrate filter arrangements for illustrating the method according to one embodiment of the invention for an output filter arrangement different to that of FIGS. 23A and 23B.
Figure 24B:
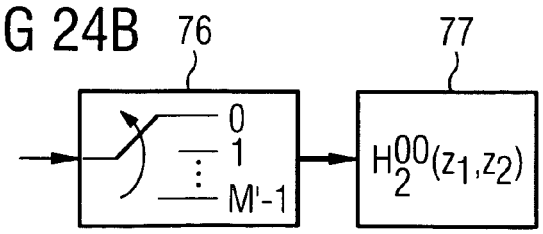

Finally the method from FIG. 14 can be applied to the filter arrangement of FIG. 24A in order to interchange the remaining polyphase component 72 with the sampling rate converter 58. The result is illustrated in FIG. 24B, in the abbreviated notation of FIG. 18C. The filter 77 corresponds in this connection to the polyphase resolution of the polyphase component 72, and block 76 contains the sampling rate converters as well as the delay elements corresponding to FIG. 18B.

A polyphase resolution is thus carried out twice in this case, once for the interchange with the sampling rate converter 1 and then for the interchange with the sampling rate converter 58.

In this case the filter 77 operates at the low output sampling rate of the original arrangement, which is reduced by the factor M' compared to the input sampling rate.

In the third case L and M are relatively prime. In principle the cases L>M and L<M may be distinguished here, which should be treated substantially identically. The case L=3 and M=2 will be illustrated here by way of example with the aid of FIGS. 25A-25D. Such a system carries out a so-called fractional interpolation. Systems with other values for L and M, where L and M are relatively prime, may be treated in a similar way.

Figure 25A:
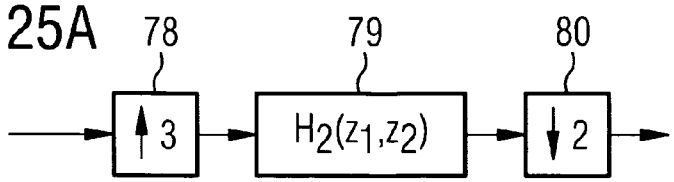

FIG. 25A illustrates the output state with a sampling rate converter 78, which increases the sampling rate by the factor 3, a homogeneous Volterra filter of $2^{nd}$ order 79, characterised by the z-transform $H2(z1,z2)$, and a sampling rate converter 80, which reduces the sampling rate by the factor 2.

Figure 25B:
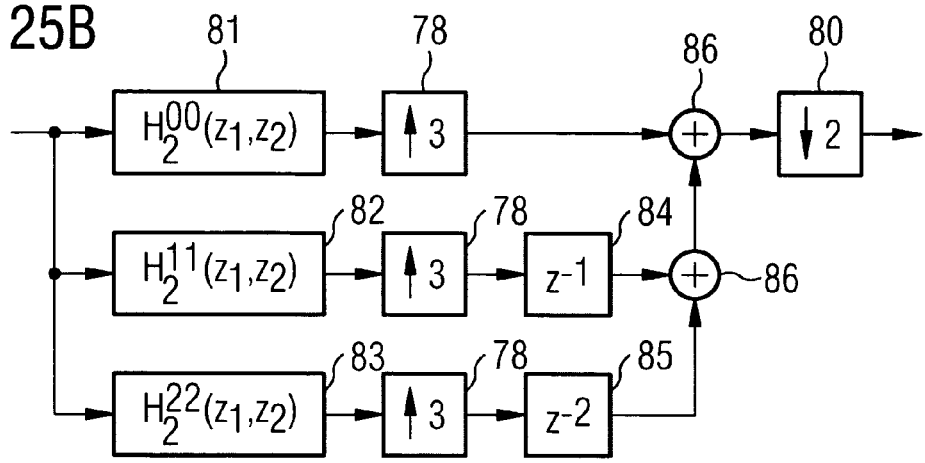

In a first step the sampling rate converter 78 is interchanged with the filter 79 in the way already described, corresponding to FIGS. 17A-17C. The result is illustrated in FIG. 25B. Filters 81-83 here represent the polyphase components of the filter 79, 84 and 85 are the correspondingly formed delay elements, and 86 are adders.

Figure 25C:
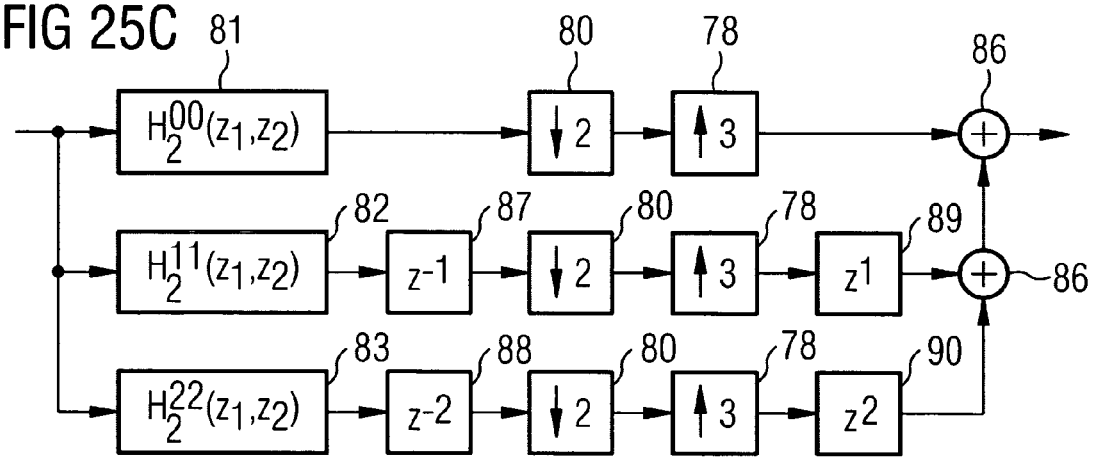

In a second step the sampling rate converter 80 is resolved into the three parallel branches and the identities of FIG. 21 and FIG. 22E are employed. The result is illustrated in FIG. 25C. In FIG. 25C delay elements 87 and 88 as well as elements 89 and 90 are present, in which element 89 contains the z-transform $z^1$ and element 90 contains the z-transform $z^2$.

Figure 25D:
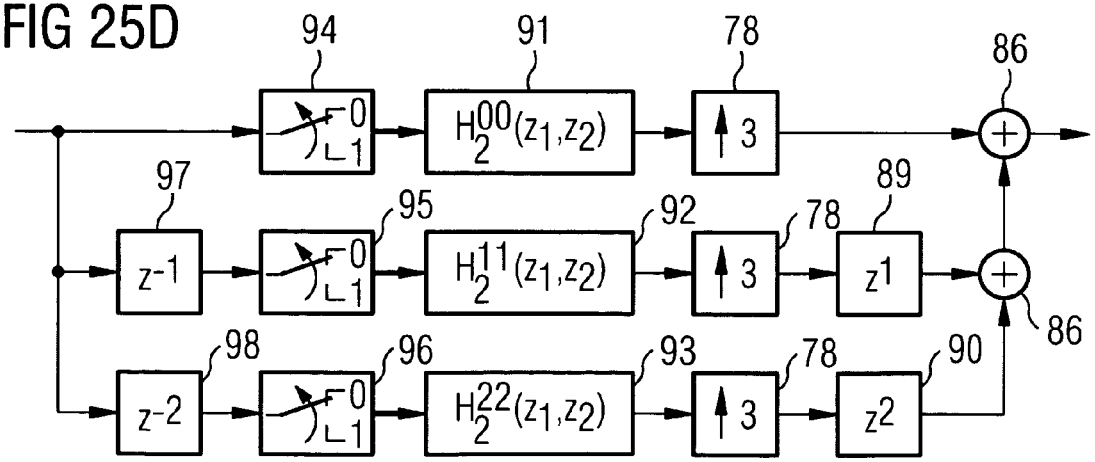

In a third step the sampling rate converters 80 are interchanged analogously to FIGS. 18A-18C with the polyphase components 81-83 corresponding to the method already described. The result is illustrated in FIG. 25D. 97 and 98 again denote delay elements, 91-93 denote the polyphase components of the components 81-83, and 94-96 denote the corresponding branchings. In the described form the system is not causal on account of the occurrence of $z^1$ and $z^2$. Accordingly a delay by two sampling values ($z^{-2}$) must in addition be introduced into all branches in order to avoid this causality problem.

The non-linear Volterra filters described hereinbefore are in principle suitable for representing a large class of non-linear filters. Possible ways of reducing the computational complexity in a special form of non-linear filters, which is illustrated in FIG. 26, will also be given hereinafter.

Figure 26:
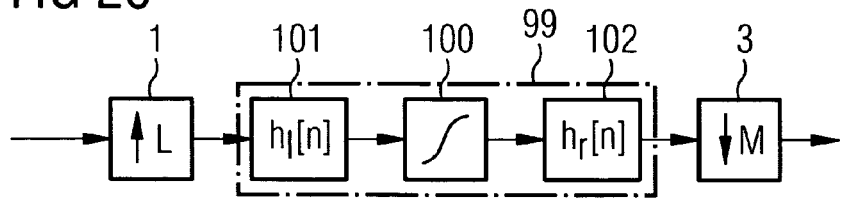
FIG. 26 illustrates a fourth filter arrangement, in which a computational complexity is to be reduced.

FIG. 26 illustrates a non-linear filter 99, which in turn is arranged between the sampling rate converter 1 and the sampling rate converter 3. The filter 99 consists of three components connected in series, namely a first linear filter 101, a memoryless or static non-linearity 100, and a second linear filter 102. The first linear filter is characterised by the impulse response h1[n] and the second linear filter 102 by the impulse response hr[n]. The linear filters 101 and 102 thus correspond in terms of their form in each case to the second term of the general non-linear Volterra filter of equation (1).

In order to reduce the computational complexity of this structure, polyphase representations of the linear filters 101 and 102 are used. These may be obtained in a similar way to the method already illustrated. In addition it should be borne in mind that a memoryless or static non-linearity 100 can be interchanged with sampling rate converters.

Figure 27A:
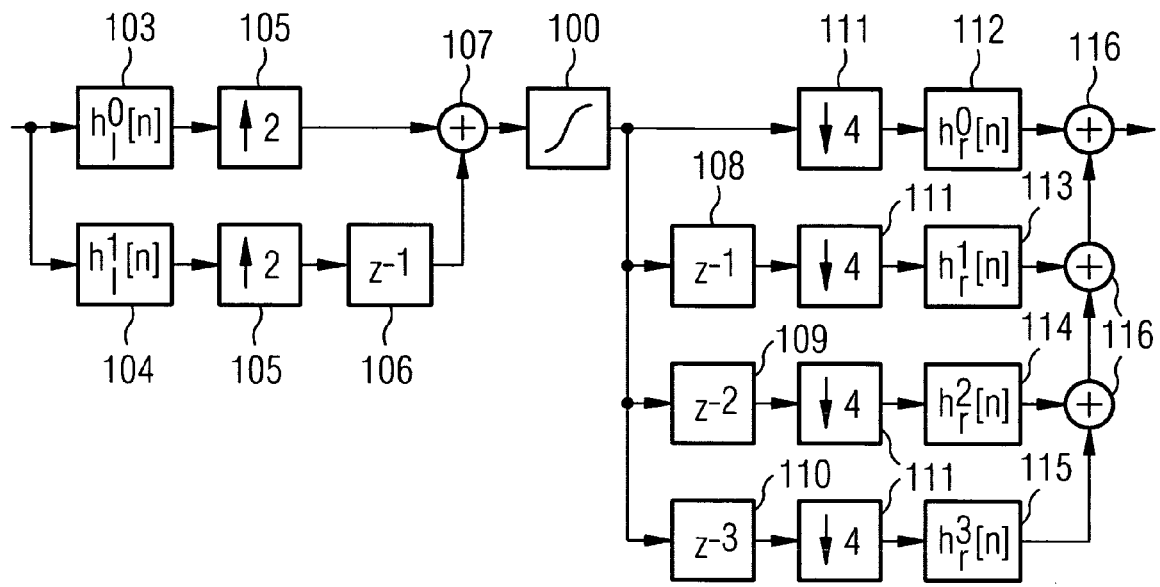
Figure 27B:
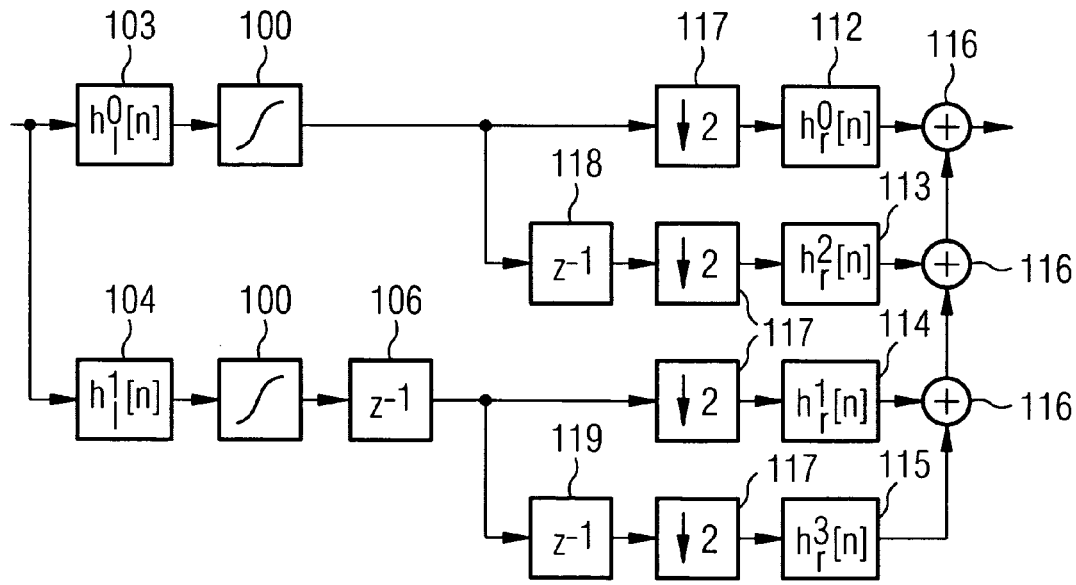

The example illustrated in FIGS. 27A and 27B illustrate for the case L=2 and M=4 how the computational complexity of the filter arrangement of FIG. 26 can be reduced.

In a first step the linear filter 101 is interchanged with the sampling rate converter 1 and the linear filter 102 is interchanged with the sampling rate converter 3, using a respective resolution into polyphase components. The result is illustrated in FIG. 27A. Polyphase components 103 and 104 correspond to the polyphase components of the first linear filter 101, the sampling rate converters 105 correspond to the sampling rate converter 1 with L=2, 106 represents a delay element, 107 an adder, and 100 again represents the memoryless or static non-linearity. 108-110 denote delay elements, 111 corresponds to the sampling rate converter 3 with M=4, and 112-115 correspond to the polyphase components of the linear filter 102. 116 denotes adders.

In a second step the memoryless non-linearity 100 is interchanged with the sampling rate converters 105.

Finally, the sampling rate converters 105 are combined with the sampling rate converters 111 using the identities of FIGS. 20, 22C and 22D. The result is illustrated in FIG. 27B. 118 and 119 here again denote delay elements. It should be noted that the computational complexity for the memoryless non-linearity is not reduced. Instead of a non-linearity at high sampling rate, the memoryless non-linearity 100 must now in fact be calculated twice at half the sampling rate. The overall computational complexity may however be reduced by the polyphase implementation of the linear filters 101 and 102.

Lastly, the use of the methods and filter arrangements described above for systems for echo compensation in communications equipment will now be discussed.

Figure 28:
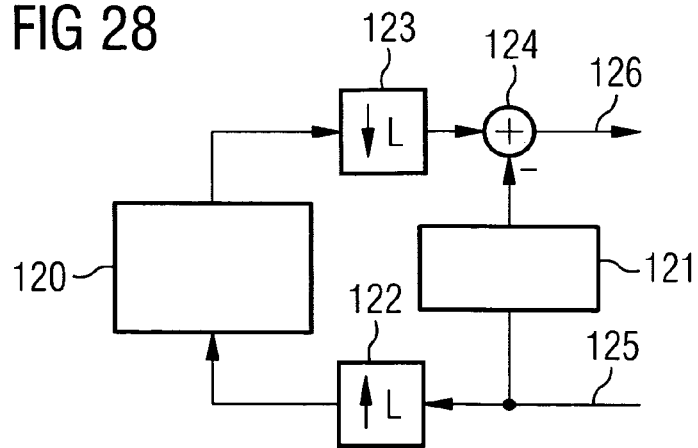
FIG. 28 illustrates the use of a non-linear filter for modelling an echo path.
Figure 34:
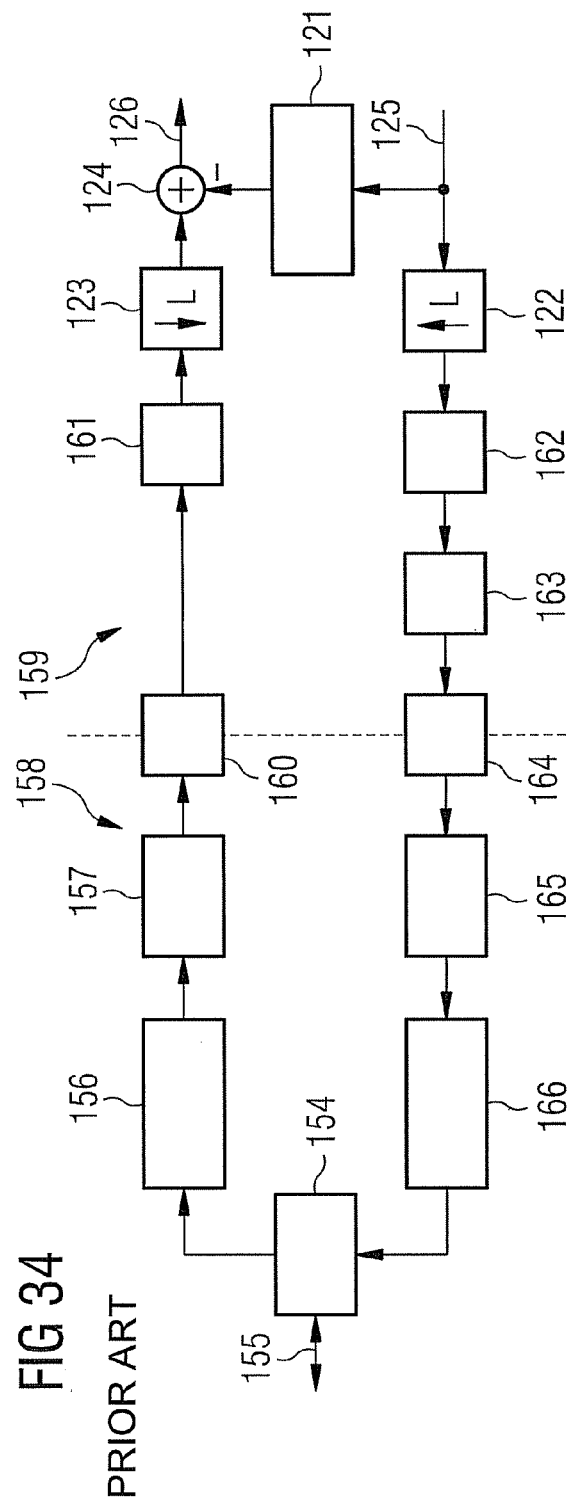
FIG. 34 illustrates a block diagram of a communications system with echo compensator.

FIG. 28 illustrates a communications device in which a transmitting/receiving path is modelled by a non-linear filter The starting point is the communications device of FIG. 34 already described in detail in the introduction to the description, with an analog part 158 and a digital part 159, in which a signal to be transmitted is passed via a connection 125 and its sampling rate is increased by a factor L in a sampling rate converter 122. In FIG. 34 the already described reception path is connected to a plurality of components, comprising a hybrid 154 via which the transmitted signal is transmitted to a transmission line 155 or by means of which a received signal is tapped from this transmission line 155, which signal is processed by further elements and is finally converted by a sampling rate converter 123 to a sampling rate that is lower by a factor L, in order to be processed further via a line 126. In addition a non-linear each filter 121 is provided, as already described.

In FIG. 28 the transmitting and receiving path from and to the sampling rate converters 122 and 123 is now replaced by a non-linear Volterra filter 120, with which the transmitting and receiving path was modeled, that is, was simulated as accurately as possible. In a further step the non-linear echo filter 121 is then formed by a filter arrangement corresponding to the sampling rate converter 122, the non-linear Volterra filter 120 and the sampling rate converter 123. The non-linear echo filter 121 thus simulates the overall transmitting/receiving path relatively accurately, and the signal emitted by the non-linear echo filter 121 can be subtracted from the received signal using an adder 124, in order to suppress as far as possible any occurring echo. Since the computational complexity for the non-linear Volterra filter 120 is very high, as illustrated by the increase of the sampling rate by the sampling rate converter 122, it is proposed according to the invention to reduce this computational complexity as described above and then express the non-linear echo filter 121 by the corresponding equivalent filter arrangement with reduced computational complexity.

Figure 29:
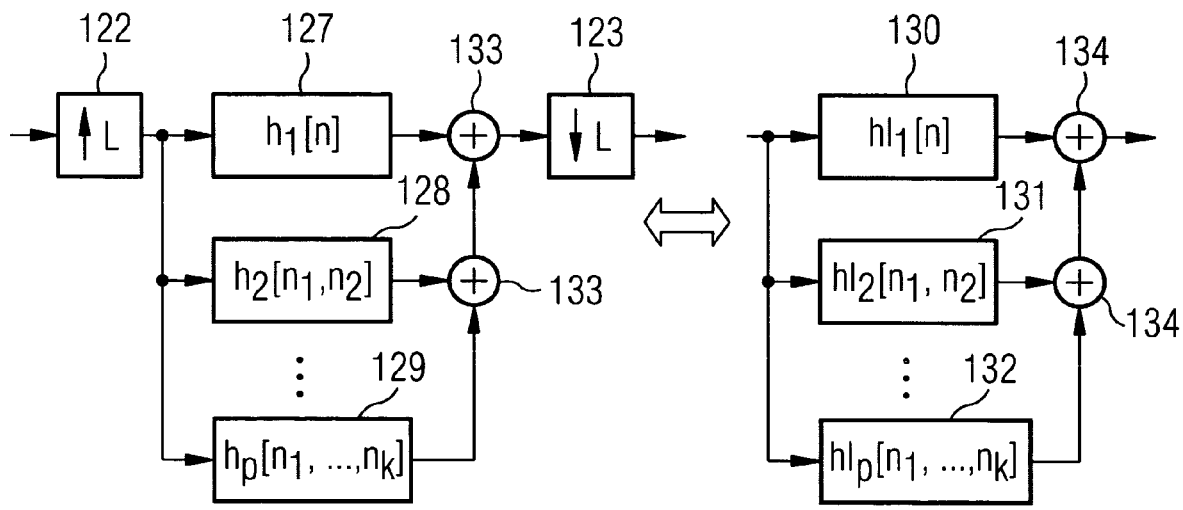
FIG. 29 illustrates diagrammatically the reduction of the computational complexity by the method according to one embodiment of the invention.

FIG. 29 illustrates diagrammatically how the computational complexity for the arrangement of sampling rate converters 122 and 123 as well as the non-linear Volterra filter 120 can be simplified by the method according to one embodiment of the invention. The initial state before using the method according to one embodiment of the invention is illustrated on the left-hand side of FIG. 29, where the non-linear Volterra filter 120 is represented by its Volterra cores 127-129. 127 represents the linear component h2[n] and 128 the Volterra core of $2^{nd}$ order h2[n1,n2], and finally 129 represents the Volterra core of $p^{th}$ order hp[n1, . . . ,nk]. As already explained, these various components may be regarded simply as a parallel circuit, whose outputs are summated with adders 133. All calculations of the partial filters 127-129 are carried out at high sampling rates. By using the method according to one embodiment of the invention, as has been described above in particular with reference to FIGS. 23A and 23B, the structure illustrated on the right-hand side of FIG. 29 is now obtained. The illustrated case corresponds to the special case L'=1 of FIGS. 23A, 23B, so that the sampling rate converters 122 and 123 cancel one another out and accordingly no sampling rate converter is necessary in the structure on the right-hand side. 130-132 denote the corresponding Volterra cores of the equivalent filter structure, in which a representation in the time range was chosen here. h11[n] corresponds in this connection to the linear component, h12[n1,n2] corresponds to the component of $2^{nd}$ order, h2[n1,n2], up to finally h1p[n1, . . . ,nk] of the filter 132 corresponds to the $p^{th}$ order component. The results are again summated with adders 134. As can be seen, all calculations now still only have to be carried out with an $L^{th}$ of the sampling rate compared with the left-hand arrangement of FIG. 29, which represents a significant reduction of the computational complexity.

Consequently a non-linear Volterra filter with either a larger memory or higher order can be used with the same available calculation time for the echo compensation, which allows a significantly improved echo compensation. Overall, for this case the computational complexity for a homogeneous Volterra core of $p^{th}$ order is reduced approximately by a factor $L^p$.

As already discussed with reference to equations (10) to (12), a number of polyphase components and thus also a number of coefficients disappear on using the zero identity from FIG. 9 and on account of the fact that the sampling rate converters 122 and 123 both operate with the factor L.

For this special case (both sampling rate converters have the same factor L) the remaining Volterra cores can be calculated as follows:

$$hL1[n1] = h1[L \cdot n] \quad (17)$$
$$hL2[n1, n2] = h2[L \cdot n1, L \cdot n2]$$
$$hL3[n1, n2, n3] = h3[L \cdot n1, L \cdot n2, L \cdot n3]$$
$$\vdots$$

For this case a core of order p and a memory length N thus becomes a core of the same order, but with a memory length reduced by a factor L. This particularly simple form is obtained since relatively many polyphase components disappear.

Figure 30:
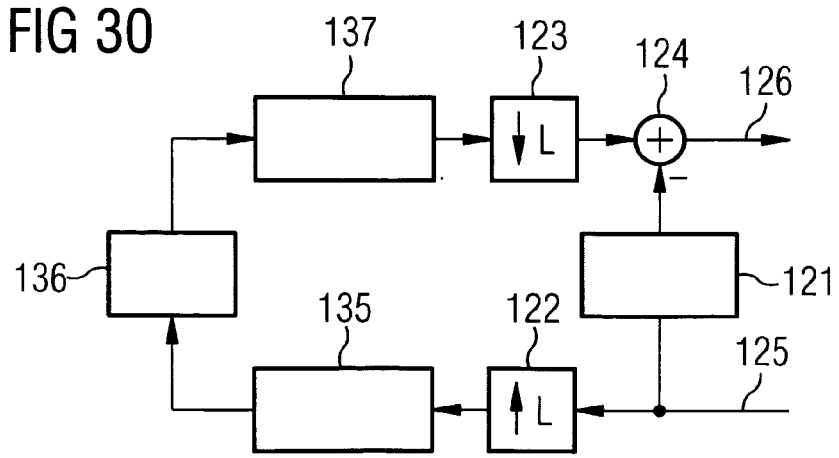
FIG. 30 illustrates the use of a further non-linear filter for modelling an echo path.

A filter arrangement similar to FIG. 28 is illustrated in FIG. 30. In the case of FIG. 30 the echo path is not simulated as in FIG. 28 by a non-linear Volterra filter 120, but instead by the arrangement, already introduced with reference to FIGS. 26 and 27, of a first linear filter 135, a static non-linearity 136 and a second linear filter 137. Even if this arrangement in general permits a less accurate simulation of the echo path than a general non-linear Volterra filter, it is nevertheless sufficient in many cases and generally has a lower computational complexity.

Again the case is considered in which the sampling rate converters 122 and 123 change the sampling rate by the same factor L.

Figure 31:
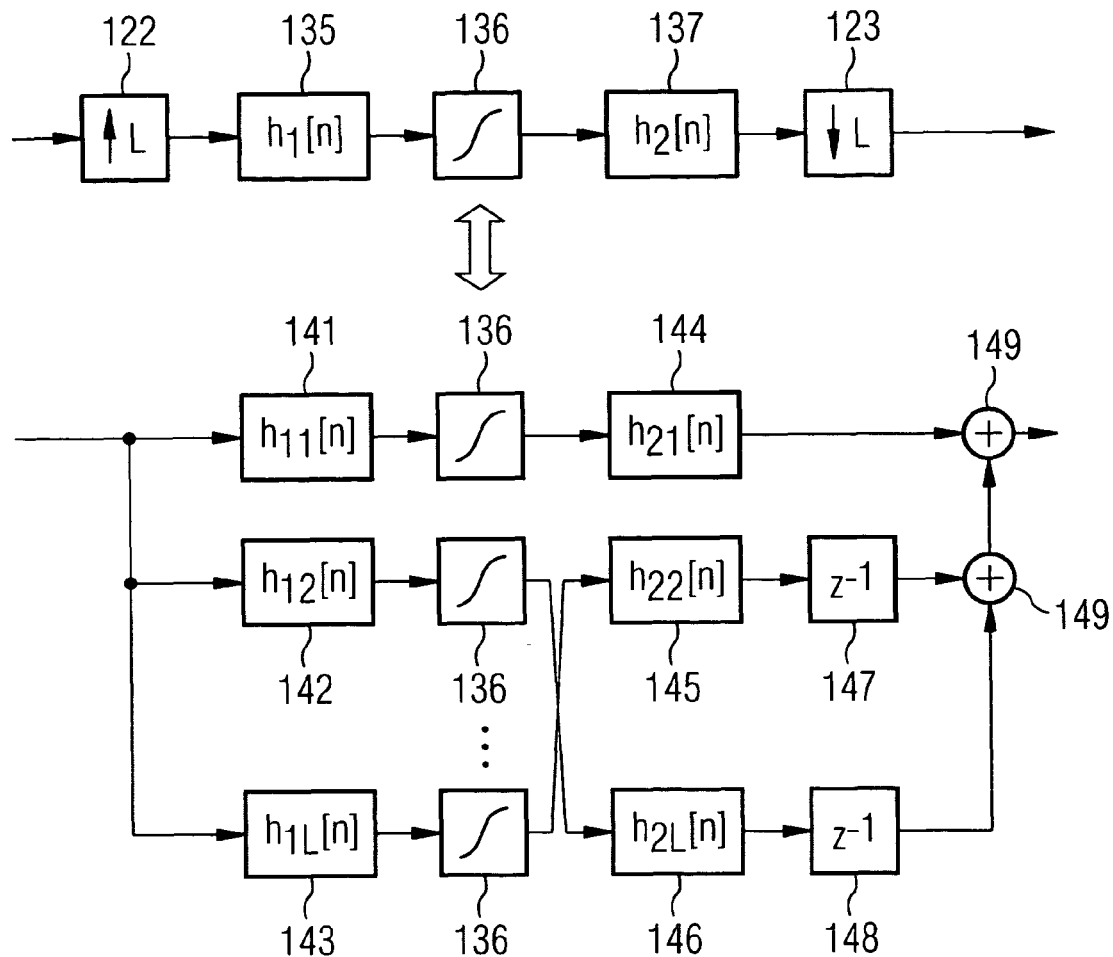
FIG. 31 illustrates diagrammatically the reduction of the computational complexity by the method according to one embodiment of the invention in the filter of FIG. 30.

In FIG. 31 it is illustrated—similar to the case with reference to FIGS. 27A and 27B—how the computational complexity of this filter arrangement can be reduced by the method according to the invention. That part of the arrangement of FIG. 30 for which the computational complexity is to be reduced is illustrated in the upper part of FIG. 31. Corresponding to the algorithm already discussed with reference to FIGS. 27A and 27B, the first linear filter 135 and the second linear filter 137, characterised by their impulse responses h1[n] and h2[n], are resolved into their polyphase components. Interchanges with the sampling rate converters 122 and 123 are then appropriately carried out, which are ultimately compensated in the illustrated examples. The result is illustrated at the foot of FIG. 31. The blocks 141-143 represent the polyphase components of the first linear filter 135 and the blocks 144-146 represent the polyphase components of the second non-linear filter 137. 147 and 148 are in each case delay elements, and 149 denotes adders. Again, the computational complexity for the static non-linearity 136 itself is not reduced, since this is present in all branches and has to be appropriately calculated.

The polyphase components h11[n],h12[n] . . . of the first linear filter 135 and the corresponding polyphase components h21[n],h22[n], . . . ,h2L[n] of the second linear filter 137 may be calculated according to the following equations:

$$h11[n] = h1[L \cdot n] \quad (18)$$
$$h12[n] = h1[L \cdot n + 1]$$
$$\vdots$$
$$h21[n] = h2[L \cdot n]$$
$$h22[n] = h2[L \cdot n + 1]$$
$$\vdots$$

Figure 32:
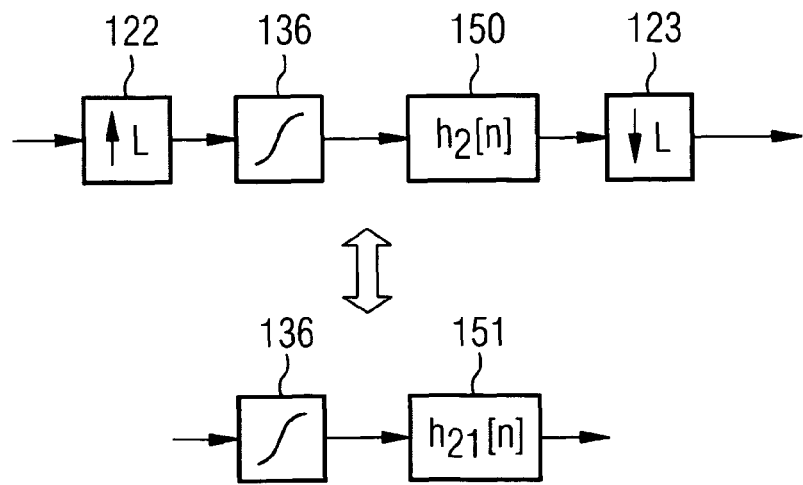
FIG. 32 illustrates diagrammatically the reduction of the computational complexity by the method according to one embodiment of the invention in an Hammerstein filter.
Figure 33:
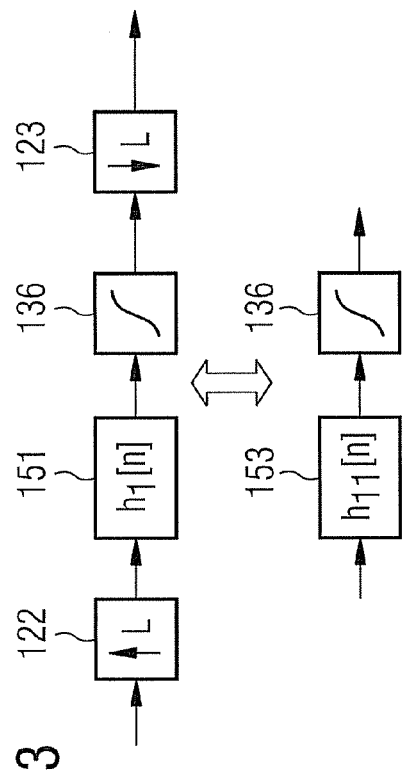
FIG. 33 illustrates diagrammatically the reduction of the computational complexity by the method according to one embodiment of the invention in a Wiener filter.

FIGS. 32 and 33 illustrate two special cases of the filter arrangement of FIGS. 30 and 31.

The so-called Hammerstein filter is illustrated diagrammatically in FIG. 32. This corresponds to the filter arrangement illustrated at the top of FIG. 31, though the first linear filter 135 is omitted and only a second linear filter 150, which follows a static non-linearity 136, is present. The treatment takes place as in the case of FIG. 31, in which here the static non-linearity 136 followed by a polyphase component 151 of the linear filter 150 is obtained as simplified structure.

FIG. 33 illustrates the case of a so-called Weiner filter, in which the second non-linear filter 137 from FIG. 31 is omitted and the filter arrangement includes a linear filter 152 followed by a static non-linearity 136. The simplified structure consists here of a polyphase component 153 of the linear (FIR) filter 152 followed by the static non-linearity 136.

To summarise, it has been shown how the computational complexity in filter arrangements that include in particular sampling rate converters can be significantly reduced by using polyphase components. In particular a higher quality in devices for echo suppression can be achieved in this way. Obviously the method according to the invention may however also be applied in filter arrangements that are used for other purposes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of implementing a non-linear filter arrangement in an echo canceller in a communication system, the method comprising:
   providing, with a sampling rate converter, a conversion of a sampling rate of a signal associated with the echo canceller;
   forming, with a processor, a non-linear filter connected in series with the sampling rate converter in a first defined order;
   resolving, with the processor, the non-linear filter into a summation of polyphase components; and
   reducing the computational complexity of the non-liner filter by:
      removing polyphase components that do not contribute to the output of the non-linear filter arrangement;
      modifying the polyphase components; and
      interchanging the modified polyphase components with the sampling rate converter so that the modified polyphase components and the sampling rate converter are in a second defined order which is the reverse of the first defined order; and
   implementing the non-linear filter arrangement with the modified polyphase components and the sampling rate converter in the second defined order in the echo canceller.

2. The method of claim 1, wherein the signal associated with the echo canceller is a signal fed to the filter.

3. The method of claim 1, wherein the signal associated with the echo canceller is a signal emitted by the filter.

4. The method of claim 1, wherein the filter is a non-linear Volterra filter.

5. The method of claim 4, wherein each homogeneous component of $n^{th}$ order of the Volterra filter is resolved according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1,z2,\ldots,zn)$ is the z-transform of the respective homogeneous component of $n^{th}$ order, L is a factor by which the conversion of the sampling rate is carried out, $Hn^{i1,i2,\ldots,in}(z1^L, \ldots zn^L)$ are the polyphase components, and are delay components.

6. The method of claim 4, wherein the polyphase component of each homogeneous component of $n^{th}$ order of the Volterra filter are calculated according to $$Hn^{i1,i2,\ldots,in}(z1^L, z2^L, \ldots, zn^L) = \sum_{m1=0}^{N} \sum_{m2=0}^{N} \ldots \sum_{mn=0}^{N} hn[i1+Lm1, i2+Lm2, \ldots, in+Lmn]z1^{-Lm1}z2^{-Lm2}\ldots zn^{-Lmn}$$

in which $Hn^{i1,i2,\ldots,in}(z1^L,z2^L,\ldots,zn^L)$ are the polyphase components of $n^{th}$ order, wherein i1,i2,...,in are indices that run from 0 to L−1, where L is a factor by which the sampling rate is converted in the conversion of the sampling rate, wherein hn is a homogeneous Volterra core of $n^{th}$ order of the Volterra filter in time representation, and where N is a memory length of the core hn.

7. The method of claim 4, wherein the polyphase components of each homogeneous component of $n^{th}$ order of the Volterra filter are calculated according to $$Hn^{i1,i2,\ldots,in}(z1^L, z2^L, \ldots, zn^L) = \sum_{m1=0}^{N} \sum_{m2=0}^{N} \ldots \sum_{mn=0}^{N} hn[i1+Lm1, i2+Lm2, \ldots, in+Lmn]z1^{-Lm1}z2^{-Lm2}\ldots zn^{-Lmn}$$

wherein $Hn^{i1,i2,\ldots,in}(z1^L,z2^L,\ldots,zn^L)$ are the polyphase components of $n^{th}$ order, wherein i1,i2,...,in are indices that run from 0 to L−1, where L is a factor by which the sampling rate is converted in the conversion of the sampling rate, wherein hn is a homogeneous Volterra core of $n^{th}$ order of the Volterra filter in time representation, wherein hn exists in triangular form, and wherein N is a memory length of the core hn.

8. A method of implementing a filter arrangement in an echo canceller in a communication system, comprising:
   increasing a sampling rate of a signal fed to a sampling rate converter by a specified factor;
   forming, with a processor, a non-linear filter connected downstream of the sampling rate converter;
   resolving, with the processor, the non-linear filter into a summation of polyphase components;
   reducing the computational complexity of the non-liner filter by:
   removing polyphase components that do not contribute to the output of the filter arrangement;
   modifying the polyphase components; and
   interchanging the modified polyphase components with said sampling rate converter so that the modified polyphase components are upstream of the sampling rate converter; and
   implementing the filter arrangement with the modified polyphase components upstream of the sampling rate converter in the echo canceller.

9. The method of claim 8, further including introducing sampling values with value zero into a signal fed to the sampling rate converter for the conversion of the sampling rate, and calculating the polyphase components according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1,z2,\ldots,zn)$ is the z-transform of the respective homogeneous component of $n^{th}$ order, L is a factor by which the conversion of the sampling rate is carried out, $Hn^{i1,i2,\ldots,in}(z1^L, z2^L, \ldots zn^L)$ are the polyphase components, and $z1^{-i1}, z2^{-i2} \ldots zn^{-in}$ are delay components, and wherein those polyphase components in which the indices $i1, z2, \ldots, in$ are not all identical are deleted.

10. The method according to claim 8, wherein the filter is a non-linear Volterra filter, wherein each homogeneous component of $n^{th}$ order of the Volterra filter (2, 120) is resolved according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1,z2,\ldots,zn)$ is the z-transform of the respective homogeneous component of $n^{th}$ order, L is a factor by which the conversion of the sampling rate is carried out, $Hn^{i1,i2,\ldots,in}(z1^L,z2^L,\ldots zn^L)$ are the polyphase components $z1^{-i1},z2^{-i2} \ldots zn^{-in}$ are delay components, wherein an identity is used for the interchange of the polyphase components with the sampling rate converters according to which a polyphase component of the form $Hn^{i1,i2,\ldots,in}(z1,z2,\ldots,zn)$ connected downstream of the sampling rate converter is identical to a polyphase component with the z-transform $Hn^{i1,i2,\ldots,in}(z1,z2,\ldots,zn)$ with sampling rate converters connected downstream.

11. The method of claim 10, wherein for $i1=i2=\ldots=in$ the factors $z1^{-i1}, z2^{-i2}, \ldots, zn^{-in}$ are in each case condensed to a separate delay element $z^{-i1}$.

12. A method of implementing a filter arrangement in an echo canceller in a communication system, comprising:
reducing a sampling rate of a signal to be fed to a sampling rate converter connected downstream of a non-linear filter;
forming, with a processor, the non-linear filter;
resolving, with the processor, the non-linear filter into a summation of polyphase components;
reducing the computational complexity of the non-liner filter by:
modifying the polyphase components; and
interchanging positions of the modified polyphase components with said sampling rate converter so that said sampling rate converter is upstream of the modified polyphase components; and
implementing the filter arrangement with the sampling rate converter upstream of the modified polyphase components in the echo canceller.

13. The method of claim 12, wherein the filter is a non-linear Volterra filter, wherein each homogeneous component of $n^{th}$ order of the Volterra filter is resolved according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1,z2,\ldots,zn)$ is the z-transform of the respective homogeneous component of $n^{th}$ order, L is a factor by which the conversion of the sampling rate is carried out, $Hn^{i1,i2,\ldots,in}(z1^L, Z2^L, \ldots zn^L)$ are the polyphase components, and $z1^{-i1}, z2^{-i2}, \ldots zn^{-in}$ are delay components, and wherein for $i1=i2=\ldots=in$ the factors $z1^{-i1}, z2^{-i2}, \ldots, zn^{-in}$ are in each case condensed to a separate delay element of the form $z1^{-i1}, z2^{-i2}, \ldots, zn^{-in}$.

14. The method of claim 12, wherein the filter is a non-linear Volterra filter, wherein each homogeneous component of $n^{th}$ order of the Volterra filter is resolved according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1,z2,\ldots,zn)$ is the z-transform of the respective homogeneous component of $n^{th}$ order, L is a factor by which the conversion of the sampling rate is carried out, $Hn^{i1,i2,\ldots,in}(z1^L,z2^L, zn^L)$ are the polyphase components, and $z1^{-i1},z2^{-i2},\ldots,zn^{-in}$ are delay components, and wherein for polyphase components in which not all indices $i1,i2,\ldots,in$ are equal, the factors $z1^{-i1},z2^{-i2},\ldots,zn^{-in}$ are used as delay elements $z1^{-i1},z2^{-i2},\ldots,zn^{-in}$ before inputs of the respective polyphase component.

15. The method of claim 12, wherein the filter is a non-linear Volterra filter, wherein each homogeneous component of $n^{th}$ order of the Volterra filter is resolved according to $$Hn(z1, z2, \ldots, zn) = \sum_{i1}^{L-1} \sum_{i2}^{L-1} \ldots \sum_{in}^{L-1} Hn^{i1,i2,\ldots,in}(z1^L, z2^L, \ldots, zn^L) \cdot z1^{-i1} z2^{-i2} \ldots zn^{-in}$$

wherein $Hn(z1,z2,\ldots,zn)$ is the z-transform of the respective homogeneous component of $n^{th}$ order, L is a factor by which the conversion of the sampling rate is carried out, $Hn^{i1,i2,\ldots,in}(z1^L,z2^L,\ldots,zn^L)$ are the polyphase components $z1^{-i1},z2^{-i2} \ldots zn^{-in}$ are delay components, wherein the interchange of the polyphase components with the sampling rate converter is carried out utilising an identity according to which a polyphase component of the form $Hn^{i1,i2,\ldots,in}(z1^L,z2^L,\ldots,zn^L)$ with a sampling rate converter connected downstream corresponds to the sampling rate converter with polyphase component of the form $Hn^{i1,i2,\ldots,in}(z1,z2,\ldots,zn)$ connected downstream.

16. A method of implementing a filter arrangement in an echo canceller in a communication system, comprising:
increasing a sampling rate of a signal fed to a first sampling rate converter by a first factor;
connecting a non-linear filter downstream of the first sampling rate converter;
connecting a second sampling rate converter downstream of the non-linear filter;

reducing a sampling rate of a signal to be fed to the second sampling rate converter by a second factor;

reducing, with a processor, a computational complexity of a first section of the filter arrangement comprising the first sampling rate converter and the non-linear filter by:
forming a form of the non-linear filter suitable for reducing the computational complexity;
resolving the non-linear filter into a summation of polyphase components;
modifying the polyphase components; and
interchanging the modified polyphase components with the first sampling rate converter so that the first sampling rate converter is downstream of the modified polyphase components of the first section; and implementing the filter arrangement with the first sampling rate converter downstream of the modified polyphase components of the first section in the echo canceller.

17. The method of claim 16, comprising:
reducing, with the processor, a computational complexity of a second section of the filter arrangement comprising the non-linear filter and the second sampling rate converter by:
forming a form of the non-linear filter suitable for reducing the computational complexity;
resolving the non-linear filter into a summation of polyphase components;
modifying the polyphase components; and
interchanging the modified polyphase components with the second sampling rate converter so that the second sampling rate converter is upstream of the modified polyphase components of the second section; and
implementing the filter arrangement with the second sampling rate converter upstream of the modified polyphase components of the second section.

18. The method of claim 16, wherein the first factor is an integral multiple of the second factor, and wherein the first sampling rate converter and the second sampling rate converter are combined to form a single sampling rate converter.

19. The method of claim 16, wherein the second factor is an integral multiple of the first factor, and wherein the first sampling rate converter and the second sampling rate converter are combined to form a single sampling rate converter.

20. The method of claim 19, wherein the single sampling rate converter is interchanged before the filter by forming a form of the non-linear filter suitable for reducing the computational complexity by resolving the filter into polyphase components in such a way that the polyphase components can be interchanged with said single sampling rate converter, and by interchanging the polyphase components with said single sampling rate converter.

21. The method of claim 19, wherein polyphase components that are coupled to delays are removed from the filter arrangement.

22. The method of claim 16, wherein the first factor and the second factor are relatively prime, wherein the computational complexity of the section comprising the first sampling rate converter and the non-linear filter is reduced by forming a form of the filter suitable for reducing the computational complexity by resolving the filter is resolved into polyphase components in such a way that the polyphase components can be interchanged with said first sampling rate converter, and by interchanging the polyphase components with the first sampling rate converter, and wherein the computational complexity of sections of the thereby formed filter arrangement comprising in each case one of the polyphase components and the second sampling rate converter, are reduced by forming a form of the respective polyphase component suitable for reducing the computational complexity by resolving the polyphase component into further polyphase components in such a way that the further polyphase components can be interchanged with said second sampling rate converter, and by interchanging the further polyphase components with the second sampling rate converter.

23. A method of implementing a filter arrangement in an echo canceller in a communication system, comprising:
increasing a sampling rate of a signal to be fed to the filter arrangement, including a first sampling rate converter, by a first factor;
connecting a first linear filter downstream of the first sampling rate converter;
connecting a static non-linearity downstream of the first linear filter;
connecting a second linear filter downstream of the static non-linearity;
connecting a second sampling rate converter downstream of the second linear filter for reducing a sampling rate of a signal to be emitted by the second linear filter by a second factor;
resolving, with a processor, the first linear filter and the second linear filter into polyphase components;
modifying the polyphase components of first linear filter and the second linear filter;
interchanging the modified polyphase components of the first linear filter with the first sampling rate converter such that the first sampling rate converter is downstream of modified polyphase components of the first linear filter; and
interchanging the modified polyphase components of the second linear filter with the second sampling rate converter such that the second sampling rate converter is upstream of the polyphase components of the second linear filter; and
implementing the filter arrangement with the first sampling rate converter downstream of modified polyphase components of the first linear filter and the second sampling rate converter upstream of the polyphase components of the second linear filter in the echo canceller.

24. The method of claim 23, further including interchanging the static non-linearity with the first sampling rate converter, and combining the first sampling rate converter and the second sampling rate converter.

25. The method of claim 23, wherein the first linear filter is a line.

26. The method of claim 23, wherein the second linear filter is a line.

27. The method of claim 23, wherein the polyphase components of at least one of the first linear filter and of the second linear filter are calculated according to $$h11[n] = h1[L \cdot n]$$
$$h12[n] = h1[L \cdot n + 1]$$
$$\vdots$$
$$h1, L-1[n] = h1[L \cdot n + L - 1]$$

wherein h1 is an impulse response of the first linear filter or of the second linear filter, respectively, n is a sampling index, h11,h12, ... ,h1,L are the polyphase components of the first non-linear filter or of the second non-linear filter, and L is the first factor or the second factor.

* * * * *